(12) United States Patent
Kuwabara

(10) Patent No.: US 8,678,958 B2
(45) Date of Patent: Mar. 25, 2014

(54) SPORTS IMPLEMENT, AMUSEMENT TOOL, AND TRAINING TOOL

(75) Inventor: Hideaki Kuwabara, Isehara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 1126 days.

(21) Appl. No.: 11/064,841

(22) Filed: Feb. 25, 2005

(65) Prior Publication Data

US 2005/0192129 A1 Sep. 1, 2005

(30) Foreign Application Priority Data

Feb. 26, 2004 (JP) ................................. 2004-052292

(51) Int. Cl.
*A63B 59/00* (2006.01)
(52) U.S. Cl.
USPC ........................................................ 473/520
(58) Field of Classification Search
USPC ................. 463/516, 519–526, 537, 551, 553; 473/516, 519–526, 537, 551, 553
See application file for complete search history.

(56) References Cited

U.S. PATENT DOCUMENTS

| | | | |
|---|---|---|---|
| 4,736,312 A | 4/1988 | Dassler et al. | |
| 4,774,677 A * | 9/1988 | Buckley | 706/23 |
| 4,780,968 A | 11/1988 | Bragagnolo | |
| 4,812,726 A | 3/1989 | Benii et al. | |
| 4,989,256 A * | 1/1991 | Buckley | 706/41 |
| 5,004,901 A | 4/1991 | Yoshimoto et al. | |
| 5,206,749 A | 4/1993 | Zavracky et al. | |
| 5,258,325 A | 11/1993 | Spitzer et al. | |
| 5,317,143 A | 5/1994 | Yoshimoto et al. | |
| 5,317,236 A | 5/1994 | Zavracky et al. | |
| 5,322,281 A | 6/1994 | Ganger | |
| 5,341,015 A | 8/1994 | Kohno | |

(Continued)

FOREIGN PATENT DOCUMENTS

| | | |
|---|---|---|
| CN | 1306874 | 8/2001 |
| CN | 1336242 | 2/2002 |

(Continued)

OTHER PUBLICATIONS

Takayama et al., "A CPU on a Plastic Film Substrate," 2004 Symposium on VLSI Technology Digest of Technial Papers, Jun. 15-17, 2004, pp. 230-231.

(Continued)

*Primary Examiner* — David L Lewis
*Assistant Examiner* — Eric M Thomas
(74) *Attorney, Agent, or Firm* — Eric J. Robinson; Robinson Intellectual Property Law Office, P.C.

(57) ABSTRACT

The present invention provides a sports implement whose characteristics a user can adjust freely and minutely. According to the present invention, it is realized that a light-weight high functional circuit is installed in various sports implements by constituting various functional circuits with a TFT formed on a film, without using a printed board. A high functional circuit using a TFT formed over a flexible plastic film is light-weight and strong in bending and impacts. It is possible to provide a sports implement that is favorable in operationality and friendly to many users in a wide range regardless of the muscle strength or physical constitution and the like of a user, since the user can adjust characteristics of a sports implement.

41 Claims, 17 Drawing Sheets

(56) References Cited

U.S. PATENT DOCUMENTS

| | | | |
|---|---|---|---|
| RE34,769 E | | 11/1994 | Yoshimoto et al. |
| 5,376,561 A | | 12/1994 | Vu et al. |
| 5,409,213 A | * | 4/1995 | Yeh ............................... 473/527 |
| 5,417,770 A | * | 5/1995 | Saitoh et al. ................. 136/258 |
| 5,500,635 A | | 3/1996 | Mott |
| 5,643,804 A | | 7/1997 | Arai et al. |
| 5,674,304 A | | 10/1997 | Fukada et al. |
| 5,757,456 A | | 5/1998 | Yamazaki et al. |
| 5,821,138 A | | 10/1998 | Yamazaki et al. |
| 5,851,862 A | | 12/1998 | Ohtani et al. |
| 5,857,694 A | | 1/1999 | Lazarus et al. |
| 5,866,987 A | | 2/1999 | Wut |
| 5,877,533 A | | 3/1999 | Arai et al. |
| 5,932,975 A | | 8/1999 | Wut |
| 6,033,974 A | | 3/2000 | Henley et al. |
| 6,037,703 A | * | 3/2000 | Kambe et al. ................. 310/338 |
| 6,043,800 A | | 3/2000 | Spitzer et al. |
| 6,118,502 A | | 9/2000 | Yamazaki et al. |
| 6,127,199 A | | 10/2000 | Inoue et al. |
| 6,268,695 B1 | | 7/2001 | Affinito |
| 6,300,927 B1 | | 10/2001 | Kubota et al. |
| 6,310,362 B1 | | 10/2001 | Takemura |
| 6,331,722 B1 | | 12/2001 | Yamazaki et al. |
| 6,362,866 B1 | | 3/2002 | Yamazaki et al. |
| 6,372,608 B1 | | 4/2002 | Shimoda et al. |
| 6,376,333 B1 | | 4/2002 | Yamazaki et al. |
| 6,410,960 B1 | | 6/2002 | Arai et al. |
| 6,485,380 B2 | * | 11/2002 | Spangler et al. .............. 473/521 |
| 6,515,334 B2 | | 2/2003 | Yamazaki et al. |
| 6,524,161 B1 | | 2/2003 | Asami |
| 6,580,177 B1 | | 6/2003 | Hagood, IV et al. |
| 6,710,410 B2 | | 3/2004 | Yamazaki et al. |
| 6,974,397 B2 | | 12/2005 | Lammer |
| 6,995,496 B1 | | 2/2006 | Hagood, IV et al. |
| 7,080,849 B2 | | 7/2006 | Lammer |
| 7,083,105 B2 | | 8/2006 | Maruyama et al. |
| 7,084,512 B2 | | 8/2006 | Higashida et al. |
| 7,101,287 B1 | | 9/2006 | Wagner |
| 7,154,148 B2 | | 12/2006 | Yamazaki et al. |
| 7,160,286 B2 | | 1/2007 | Lammer |
| 7,201,813 B2 | | 4/2007 | Shimura |
| 7,226,817 B2 | | 6/2007 | Tanada et al. |
| 7,230,316 B2 | | 6/2007 | Yamazaki et al. |
| 7,241,666 B2 | | 7/2007 | Goto et al. |
| 7,351,300 B2 | | 4/2008 | Takayama et al. |
| 7,825,002 B2 | | 11/2010 | Takayama et al. |
| 2001/0001770 A1 | | 5/2001 | Spangler et al. |
| 2003/0032210 A1 | | 2/2003 | Takayama et al. |
| 2003/0047280 A1 | * | 3/2003 | Takayama et al. ............ 156/344 |
| 2003/0064569 A1 | | 4/2003 | Takayama et al. |
| 2003/0139155 A1 | | 7/2003 | Sakai |
| 2004/0128246 A1 | | 7/2004 | Takayama et al. |
| 2004/0129450 A1 | | 7/2004 | Yamazaki et al. |
| 2004/0152544 A1 | * | 8/2004 | Lammer ....................... 473/520 |
| 2006/0138427 A1 | | 6/2006 | Yamazaki et al. |
| 2006/0202349 A1 | | 9/2006 | Higashida et al. |
| 2009/0291516 A1 | | 11/2009 | Takayama et al. |

FOREIGN PATENT DOCUMENTS

| | | |
|---|---|---|
| EP | 1 095 684 | 5/2001 |
| EP | 1 177 816 | 2/2002 |
| EP | 1327466 A | 7/2003 |
| EP | 1552968 A | 7/2005 |
| JP | 60-024686 | 2/1985 |
| JP | 64-007329 A | 1/1989 |
| JP | 06-210041 A | 8/1994 |
| JP | 06-254185 | 9/1994 |
| JP | 09-500039 | 1/1997 |
| JP | 10-125929 | 5/1998 |
| JP | 10-125930 | 5/1998 |
| JP | 10-125931 | 5/1998 |
| JP | 10-127059 | 5/1998 |
| JP | 10-229902 | 9/1998 |
| JP | 3058122 | 6/1999 |
| JP | 11-244422 | 9/1999 |
| JP | 2001-204507 A | 7/2001 |
| JP | 2001-282399 | 10/2001 |
| JP | 2002-076291 A | 3/2002 |
| JP | 2002-102392 A | 4/2002 |
| JP | 2002-209607 | 7/2002 |
| JP | 2002-218769 | 8/2002 |
| JP | 2003-033050 | 1/2003 |
| JP | 2003-502000 | 1/2003 |
| JP | 2003-069433 | 3/2003 |
| JP | 2003-133971 | 5/2003 |
| JP | 2003-174153 | 6/2003 |
| JP | 2003-197527 A | 7/2003 |
| JP | 2003-220168 A | 8/2003 |
| JP | 2003-224366 A | 8/2003 |
| JP | 2003-263616 A | 9/2003 |
| JP | 2004-015415 A | 1/2004 |
| JP | 2004-016451 A | 1/2004 |
| JP | 2004-090775 A | 3/2004 |
| KR | 1998-0024765 A | 7/1998 |
| KR | 1999-0038181 A | 6/1999 |
| TW | 163635 | 7/1991 |
| TW | 424503 | 3/2001 |
| TW | 558743 | 10/2003 |
| TW | 576242 | 2/2004 |
| WO | WO-94/25118 | 11/1994 |
| WO | WO-00/74224 | 12/2000 |

OTHER PUBLICATIONS

Office Action (Application No. 200510071753.2) dated Dec. 5, 2008 with English translation.

Taiwanese Office Action (Application No. 094104516) Dated Mar. 16, 2012.

Taiwanese Office Action (Application No. 094104516) Dated Aug. 27, 2012.

Korean Office Action (Application No. 2005-0014845) Dated Oct. 9, 2012.

* cited by examiner

21: piezoelectric material layer

Fig. 2B equivalent circuit

SPORTS IMPLEMENT, AMUSEMENT TOOL, AND TRAINING TOOL

BACKGROUND OF THE INVENTION

1. Field of the Invention

The present invention relates to a sports implement (an implement used in sporting, sports goods, sports equipment) having a circuit comprising a thin film transistor (hereinafter, referred to as a TFT) using a semiconductor thin film (the thickness of about several nm to several hundred nm), specifically, to a sports implement including a light emitting display device having a piezoelectric element, a semiconductor circuit or an organic light emitting element as a component. Further, the present invention also relates to an amusement tool or a training tool having a circuit configured by a TFT.

In this specification, the term "semiconductor circuit" includes general circuits that can function using semiconductor characteristics.

2. Description of the Related Art

In recent years, a sports implement including an IC hip, (e.g., manufactured by HEAD) such as a tennis racket, a ski or a snowboard has been sold. Reference 1 (U.S. Pat. No. 5,857,694) describes a specific configuration of such a sports implement. According to Reference 1, such sports implement includes an electric actuator and a circuit attached with the electric actuator. The electric actuator eliminates vibration and adjusts performance of such a sports implement to various situations.

A circuit used in such a sports implement is a processing circuit for amplifying and controlling mutually to compensate strain detected in the sports implement or to only influence on performance by varying stiffness of the sports implement. A circuit used in such a sports implement is mounted as a chip.

SUMMARY OF THE INVENTION

A conventional sport implement having a chip changes vibration or an impact into electric energy, and changes the stiffness using the electric energy. Although the conventional sport implement is adjusted depending on the use situation, it is unchanged that a user still operates the sports implement according to characteristics of the sports implement.

Such a conventional sports implement installing a chip is developed so as to enhance stiffness or performance of impact absorption and the like.

For example, an effect that a frame shape is recovered by electric energy that is changed from mechanical energy of an impact from a ball or an impact absorption effect is obtained, as for a tennis racket. A tennis player can hit back a ball with power since bending of the racket frame is suppressed and the ball impact is eased, but he/she has to be accustomed to the behavior. Such a racket is a high-performance racket that can reduce impacts by 20 to 50 percents, but the user get tired of the racket since it has one pattern behavior.

In view of the above problems, the present invention provides a sports implement whose characteristics a user can adjust freely and minutely.

The present invention provides a sports implement, an amusement tool or a training tool in which a high functional circuit can be provided on a curved surface as well as a plane face, which is light-weight, and which has a high functional circuit can resist bending or an impact According to the present invention, a circuit used in a sports implement has a function that a user can conduct an input operation to the circuit and adjust a sports implement characteristics in a phased manner. To achieve that, a circuit is more integrated and various functional circuits are installed in a sports implement. It is necessary to enlarge a chip in size for integrating a circuit. However, a single crystal silicon chip used in a conventional sports implement is stronger mechanically as the size is smaller, and it has an adverse effect that the single crystal silicon chip is weaker in an impact as the size is larger. When such a single crystal silicon chip becomes larger in size, the number of chips manufactured on an expensive single silicon substrate (disc-shaped) is reduced and the manufacturing cost is high, which is an adverse effect. Thus, there is a limitation on a chip size as long as a single crystal silicon substrate is used.

According to the description of Reference 1, a used circuit incorporates a dual FET amplifier, a sensor element, a diode chip, a resistor, and a capacitor. A space is needed in a sports implement so that the chip can be incorporated in the sports implement. In addition, such parts are mounted on a printed board and noise is easy to superpose.

According to the present invention, it is realized that a light-weight high functional circuit (a CPU, a power supply circuit, a memory, a receiving circuit, a transmitting circuit, an amplifier circuit, a switch circuit, a display portion or the like) is installed in various sports implements by constituting various functional circuits with a TFT formed on a film, without using a printed board. It is possible to form a plurality of circuits integrally on the same substrate, to reduce the cost and to eliminate the area for mounting. Since a TFT is a film-like, the TFT occupies little space for being incorporated in a sports implement, and attachment/detachment such that a high function circuit can be attached thereto or separated is possible. For example, a high functional circuit (a CPU, a power supply circuit, a memory, a receiving circuit, a transmitting circuit, an amplifier circuit, a switch circuit, a display portion or the like) can be attached onto a ball. Because a plurality of circuits are connected on the same substrate, noise is hard to superpose.

Specifically, a high functional circuit is attached onto a curved surface of a ball and energy (an impact or a vibration) applied to the ball is changed into electricity and amplified, and light can be emitted by the electricity. The ball becomes also a novel amusement tool. For example, the ball can be applied to a sports game of soccer in a game arcade or the like. If a player kicks a soccer ball toward a light transmitting sheet, a kicked portion of the soccer ball emits light at the instance when the soccer ball is kicked, and the ball also emits light at the instance when the ball is hit on the sheet. If an imaging unit is provided on the opposite side of the player through the sheet, the position of the sheet on which the ball is hit or the kicked position of the ball can be recognized.

For example, an amplifier circuit is formed from a TFT, and a TFT connecting a gate and a drain (such a connection is referred to as a diode connection) is used as a diode. A central processing unit (CPU) including an arithmetical portion and a control portion, or a memory portion (memory) can be also configured by a TFT using a polycrystalline semiconductor as an active layer. If a CPU can be provided in a sports implement, various setting is possible.

In addition, when using a circuit in which high electron field-effect mobility is not needed for a TFT (e.g., a switch circuit), a TFT using a semiamorphous semiconductor or organics (such as pentacene or carbon nanotube) may be used without limiting to a TFT using a polycrystalline semiconductor as an active layer In addition, a TFT is provided over a flexible substrate, typically, a flexible plastic film according to the present invention. The applicant uses the separation method that does not damage a layer to be peeled and the separation method that does not give a limitation to a process of a layer to be peeled by a technique as claimed in Japanese Patent Laid-Open No. 2003-174153, and thus it is possible to separate and transfer an element having high electric characteristics and a circuit including the element.

A TFT using a polysilicon as an active layer can be provided over a flexible substrate or a film by the technique as described in Japanese Patent Laid-Open No. 2003-174153, and thus, the size can be designed depending on each shape of various sports implements. Note that the method for providing a TFT over a flexible plastic film is not limited to the above described method (Japanese Patent Laid-Open No. 2003-174153). For example, a method by which a separation layer is formed between a layer to be peeled and a substrate, and the layer to be peeled is separated from the substrate by removing the separation layer with a chemical (etchant) or an etching gas, or a method by which a separation layer made of an amorphous silicon (or polysilicon) is provided between a layer to be peeled and a substrate and the amorphous silicon is dehydrogenized by laser irradiation through the substrate and a space is generated, thereby separating the layer to be peeled from the substrate, or the like can be employed. Note that it is preferable that an element included in the layer to be peeled is formed at a heat treatment temperature of 410° C. or lower so that hydrogen is not released before the separation, in the case of using laser light.

A cross sectional SEM photography of a TFT which is actually transferred onto a film substrate is shown in FIG. 11 and FIG. 12. FIG. 12 is an enlarged view of the FIG. 11. As apparent from FIG. 12, a TFT having a single drain structure with the gate length of 1.2 μm can be confirmed.

It is possible to configure a CPU that is a representative high functional circuit with about 27000 TFTs and to realize a layout of a chip area of 100 mm². As shown in FIG. 13, twelve chips can be obtained from a five-inch substrate.

FIG. 14 is a photograph of one chip to which is pressure-bonded by an FPC after sectioning. When the FPC is pressure-bonded, it can be mounted on without defects of a wire-breaking such as crack.

FIG. 17 shows a block diagram of one chip and is describes hereinafter.

When an opecode is inputted into an interface 1701, the code is decrypted in an analysis unit 1703 (also referred to as an Instruction Decoder), and a signal is inputted into a control signal generation unit 1704 (a CPU Timing Control). When the signal is inputted, a control signal is outputted from the control signal generation unit 1704 to an arithmetic logical unit 1709 (hereinafter, an ALU) and a memory unit 1710 (hereinafter, a Register).

The control signal generation unit 1704 includes an ALU controller 1705 for controlling the ALU 1709 (hereinafter, an ACON), a unit 1706 for controlling the Register 1710 (hereinafter, a RCON), a timing controller 1707 for controlling timing (hereinafter, a TCON), and an interruption controller 1708 for controlling interruption (hereinafter, an ICON).

On the other hand, when an operand is inputted into the interface 1701, the operand is outputted to the ALU 1709 and the Register 1710. Then, a processing based on a control signal, which is inputted from the control signal generation unit 1704 (for example, a memory read cycle, a memory write cycle, an I/O read cycle, an I/O write cycle, or the like), is carried out.

The Register 1710 includes a general resister, a stack pointer (an SP), a program counter (a PC), and the like.

An address controller 1711 (hereinafter, an ADRC) outputs 16 bits address.

A structure of the CPU described in FIG. 17 is an example of a CPU and does not limit the structure of the invention. Therefore, it is possible to use a known structure of a CPU other than that shown in FIG. 17.

According to the present invention, a higher functional circuit (a CPU, a power supply circuit, a memory, a receiving circuit, a transmitting circuit, an amplifier circuit, a switch circuit, a display portion or the like) is installed in a sports implement and therefore, it is realized that a user operates an installed high functional circuit and adjusts characteristics of a sports implement. A high functional circuit using a TFT formed over a flexible plastic film is light-weight and strong in bending and impacts.

A high functional circuit (a CPU, a power supply circuit, a memory, a receiving circuit, a transmitting circuit, an amplifier circuit, a switch circuit, a display portion or the like) can be provided for clothes. It is possible to conduct motion interpretation or movement analysis by installing a plurality of high functional circuits in each point of shirts or spats, and chasing a movement at each point of a human body in sports and rehabilitation. A user wears clothes having a high functional circuit at least having a transmitting circuit or a receiving circuit, a gate having a transmitting circuit or a receiving circuit is installed at a start point and a goal point respectively, thereby making it possible to train alone and to measure a time by himself/herself.

Note that one or both of the transmitting circuit and the receiving circuit has/have an antenna in this specification.

One feature of the present invention is that a plurality of piezoelectric elements are provided for a sports implement because a large amount of electric power is required to drive various circuits. Electric power is generated by warping a piezoelectric element and amplified by an amplifier circuit to be used. Electric power may be generated by warping a piezoelectric element and charged in a charging unit every time electric power is generated.

A pointless electric power transmission module capable of charging without contact may be provided in a sports implement. The pointless electric power transmission module conducts charging by a method of supplying electric power to a secondary coil without contact by an electromagnetic induction method in which a primary coil (battery charger) is coupled with the secondary coil (main body) electromagnetically and voltage is generated in the secondary coil by an alternating magnetic field generated from the primary coil.

An auxiliary power (a primary battery or a secondary battery) to assist insufficient electric power, e.g., a sheet-like battery can be installed or attached.

A structure described in this specification is a sports implement comprising: a piezoelectric element which generates a signal by warping the piezoelectric element due to a vibration or impact applied thereto; an amplifier circuit which amplifies the signal to produce an amplified signal and which is operationally connected to the piezoelectric element; and an instruction unit which determines an application of the amplified signal to the piezoelectric element.

In the above described structure, the sports implement further comprising a rectifier unit for rectifying the amplified signal prior to the application thereof to the piezoelectric element.

One feature of the above-mentioned configuration is that further comprising a rectifier unit for rectifying the amplified signal prior to the application thereof to the piezoelectric element.

In the above described structures, the amplifier circuit includes at least a TFT.

One feature of the above-mentioned configuration is that further comprising a display portion for displaying a result of the voltage application obtained in the instruction unit.

One feature of the above-mentioned configuration is that further comprising a receiving circuit including an antenna for receiving a signal voltage application to the piezoelectric element.

One feature of each above-mentioned configuration is that further comprising a central processing unit.

One feature of each above-mentioned configuration is that further comprising a memory element.

One feature of each above-mentioned configuration is that the piezoelectric element is warped by being applied to a vibration or impact to generate electric power, and the sports implement becomes warm or cool by the electric power.

In the above described structures, the sports implement is one of a hitting sports implement, a winter sports implement, a training wear, an insole, and shoes.

Another structure described in this specification is a sports implement comprising: a first piezoelectric element; a second piezoelectric element; a first amplifier circuit including a TFT; a second amplifier circuit including a TFT; an instruction unit for determining voltage application to the first piezoelectric element; and a charging unit for storing electric power, wherein electric power is generated by warping the second piezoelectric element with a given vibration or impact to produce a signal, and the signal is amplified in the second amplifier circuit.

It is possible to provide a sports implement that is favorable in operationality and friendly to many users in a wide range regardless of the muscle strength or physical constitution and the like of a user, since the user can adjust characteristics of a sports implement.

Another structure described in this specification is a sports implement described in the comprising: a piezoelectric element; an amplifier circuit including a TFT; an instruction unit for determining voltage application to the piezoelectric element; a display portion for displaying a result of the voltage application obtained in the instruction unit; an electric power generation unit; and a charging unit for storing electric power, wherein a signal is amplified in the amplifier circuit.

According to the present invention, a display portion is provided for a sports implement and an adjusted value is output and displayed thereon so as to be recognized by a user so that the user can adjust a sports implement, which is convenient. The output display is preferably conducted in a display device using an electroluminescent element (EL element). In addition, the display device may be used for simple monochrome display or display of figures. According to the present invention, a circuit can be formed over the same substrate as a display device and installed in a sports implement.

As for a sports implement which has a difficulty in installing a display portion therein, a transmitting circuit may be provided in a sports implement and may receive a signal from a receiving circuit provided in an external terminal to confirm the display with the external terminal.

Another structure described in this specification is a sports implement comprising: a first piezoelectric element; a second piezoelectric element; a first amplifier circuit including a TFT; a second amplifier circuit including a TFT; a receiving circuit for receiving a signal voltage application to the first piezoelectric element; and a charging unit for storing electric power, wherein electric power is generated by warping the second piezoelectric element with a given vibration or impact to produce a signal, and the signal is amplified in the second amplifier circuit.

A sports implement may be adjusted by using an external terminal through remote-controlling. In that case, it is preferable to employ an adjustable system by which a receiving circuit is provided for a sports implement, receives a signal from a receiving circuit provided in an external terminal, and the signal is processed in a central processing unit to rewrite setting of a memory portion. If a transmitting circuit and a receiving circuit are provided for a sports implement, it can be checked whether circuits provided for the sports implement operate normally or not.

A charging unit is preferably for driving the central processing unit. Another structure described in this specification is a sports implement comprising: a first piezoelectric element; a second piezoelectric element; a first amplifier circuit including a TFT; a second amplifier circuit including a TFT; a central processing unit for controlling application of voltage to the first piezoelectric element; and a charging unit for storing electric power, wherein electric power is generated by warping the second piezoelectric element with a given vibration or impact to produce a signal, and the signal is amplified in the second amplifier circuit, and the central processing unit includes a TFT.

There is a possibility that electric power of an piezoelectric element obtained by an impact on a sports implement is insufficient for driving a high functional circuit such as a central processing unit. For this reason, it is preferable that an electric power generation unit for compensating insufficient electric power, such as a photovoltaic device (e.g., solar battery) or a thermo electric generator (e.g., Seebeck element) can be installed in or attached onto a sports implement.

Another structure described in this specification is a sports implement comprising: a piezoelectric element; an amplifier circuit including a TFT; a central processing unit for controlling application of voltage to the piezoelectric element; an electric power generation unit; and a charging unit, wherein a signal is amplified in the amplifier circuit, and the central processing unit includes a TFT.

In the above structures, a single crystal such as a quartz crystal, $LiNbO_3$ or $LiTaO_3$; a ceramics material such as PZT; a polymer material (high-weight molecular material) such as polyvinylidene fluoride (PVDF), or a copolymer with vinylidene fluoride and ethylene fluoride; or a semiconductor thin film that is formed made of ZnO, CdS, AiN or the like by sputtering is given as a piezoelectric element used for a piezoelectric element. In addition, a ceramic fiber generating a piezoelectric effect (typically, Intellifiber) or a plastic sheet generating a piezoelectric effect (a plastic sheet containing ceramic powders, tourmaline powders, small bits of quartz crystal or Rochelle salt or small bits of barium titanate) may be used. The polymer material, the sputtered semiconductor film or the plastic sheet is preferably used if a TFT and a piezoelectric element are formed integrally.

A circuit using a TFT (hereinafter, referred to as a TFT circuit) and a piezoelectric element are arranged appropriately in a sports implement with the use of an effect that a TFT generates heat by being driven.

Another structure described in this specification is a sports implement comprising: a piezoelectric element; and a circuit including a TFT, wherein the piezoelectric element is warped by a given vibration or impact to generate electric power, and the circuit including a TFT is driven by the electric power to heat.

For example, if a TFT circuit is provided in a position near a face contacting a snow surface of a ski or a snowboard (excluding a sole face), the sole can be heated indirectly by heat of the TFT, and thus, the speed of skiing or snowboarding is increased. The speed of skiing or snowboarding may be increased by installing a TFT circuit in a position close to an edge of a ski or a snowboard and heating the edge indirectly. If a TFT circuit is installed in a position close to the edge, the TFT is preferably installed on a nose side, not on a tail side that makes a pile of snow in stopping.

A piezoelectric element is provided for a sole of ice skating shoes, and a TFT circuit is installed in a position close to the edge to heat the edge indirectly so as to increase the skating speed.

Further, an amplifier circuit including a piezoelectric element and a TFT may be installed in bindings of snowboard boots or ski boots. In addition, a central processing unit (CPU) including a TFT is preferably installed when various circuits are installed. A binding and boots also receive a vibration or an impact similarly to a ski or a snowboard in skiing or snowboarding. For example, a piezoelectric element is arranged in a sole portion of boots, generated electric power is charged in a charging portion, the fixation degree in a portion covering a foot excluding its bottom may be adjusted by switching with an instruction of a user. Impact absorption is done effectively by providing the piezoelectric element for a sole portion of boots.

A piezoelectric element is provided in a sole portion of boots, preferably in a shank, a TFT circuit arranged in the toe portions of the boots generates heat using electric power obtained by a vibration or an impact on the sole portion, thereby indirectly warming the toes that are easily chilled or preventing heat radiation to the outside by a rapid temperature change. An insole having an amplifier circuit including a piezoelectric element and a TFT may be arranged in boots without being directly incorporated in boots themselves.

A amplifier circuit including a piezoelectric element and a TFT may be formed in running shoes. In addition, it is preferable that a central processing unit (CPU) including a TFT is arranged when various circuits are installed. A piezoelectric element is arranged in a sole portion and warming foots is conducted by heating a TFT circuit using a power generated by a vibration or an impact to the sole portion when it is cold. When it is hot, a peltiert element is provided separately and the peltiert element is driven with the power from the piezoelectric element to cool foots down. A temperature sensor is arranged and heating and cooling are switched automatically by being controlled with a CPU depending on a temperature of the temperature sensor.

An amplifier circuit including a piezoelectric element and a TFT may be arranged in indoor sports shoes. In addition, if various circuits are installed, a central processing unit (CPU) including a TFT is preferably provided. For example, as for basket shoes, shoes whose sole face is soft have strong grip and does not slip easily. If the thickness of the sole is reduced, it can be warmed by the feet temperature of a user. However, there has been only a method of warming by floor friction since the thickness enough to absorb an impact is needed or an aircushion is provided. For this reason, a piezoelectric element is provided in a sole portion of shoes, preferably in a shank, and the entire sole is warmed rapidly by electric power obtained by a vibration or an impact onto the sole portion and the sole surface made of resin is softened.

In the above described structures, the sports implement includes a hitting sports implement such as a tennis racket, a baseball bat, a baseball glove, a boxing glove, and a golf club, winter sports implements such a ski, a snowboard, a skiwear, and a snowboardwear, and shoes.

Various circuits may be provided for training tools, e.g., training machine to be deformed by a user, health appliances for muscles, amusement tools and the like without being limited to the above described sports implements. In the training machines, load can be changed according to the number of repeated vibrations by installing a circuit.

According to the present invention, various circuits can be integrated and a sports implement having adjustment mechanism can be provided. In addition, a user can adjust characteristics of a sports implement freely by himself/herself (on his/her own).

Another structure described in this specification is a sports implement comprising: a piezoelectric element which generates a signal by warping the piezoelectric element due to a vibration or impact applied thereto; an amplifier circuit which amplifies the signal to produce an amplified signal and which is operationally connected to the piezoelectric element; an instruction unit which determines an application of the amplified signal to the piezoelectric element; a power supply circuit operationally connected to the amplifier circuit; and a charging unit for storing electric power, that operationally connected to the power supply circuit.

In the above described structure, the sports implement further comprising a rectifier unit for rectifying the amplified signal prior to the application thereof to the piezoelectric element.

One feature of the above-mentioned configuration is that further comprising a rectifier unit for rectifying the amplified signal prior to the application thereof to the piezoelectric element.

In the above described structure, the amplifier circuit includes at least a TFT.

One feature of the above-mentioned configuration is that further comprising a display portion for displaying a result of the voltage application obtained in the instruction unit.

One feature of the above-mentioned configuration is that further comprising a receiving circuit including an antenna for receiving a signal voltage application to the piezoelectric element.

One feature of each above-mentioned configuration is that further comprising a central processing unit.

One feature of each above-mentioned configuration is that further comprising a memory element.

One feature of each above-mentioned configuration is that the piezoelectric element is warped by being applied to a vibration or impact to generate electric power, and the sports implement becomes warm or cool by the electric power.

In the above described structure, the sports implement is one of a hitting sports implement, a winter sports implement, a training wear, an insole, and shoes.

Another structure described in this specification is a sports implement comprising: a piezoelectric element which generates a signal by warping the piezoelectric element due to a vibration or impact applied thereto; an amplifier circuit which amplifies the signal to produce an amplified signal and which is operationally connected to the piezoelectric element; an instruction unit which determines an application of the amplified signal to the piezoelectric element; a power supply circuit operationally connected to the amplifier circuit; a charging unit for storing electric power, that operationally connected to the power supply circuit; and an electric power generation unit operationally connected to the charging unit.

In the above described structure, the sports implement further comprising a rectifier unit for rectifying the amplified signal prior to the application thereof to the piezoelectric element.

One feature of the above-mentioned configuration is that further comprising a rectifier unit for rectifying the amplified signal prior to the application thereof to the piezoelectric element.

In the above described structure, the amplifier circuit includes at least a TFT.

One feature of the above-mentioned configuration is that further comprising a display portion for displaying a result of the voltage application obtained in the instruction unit.

One feature of the above-mentioned configuration is that further comprising a receiving circuit including an antenna for receiving a signal voltage application to the piezoelectric element.

One feature of each above-mentioned configuration is that further comprising a central processing unit.

One feature of each above-mentioned configuration is that further comprising a memory element.

One feature of each above-mentioned configuration is that the piezoelectric element is warped by being applied to a vibration or impact to generate electric power, and the sports implement becomes warm or cool by the electric power.

In the above described structure, the sports implement is one of a hitting sports implement, a winter sports implement, a training wear, an insole, and shoes.

Another structure described in this specification is a sports implement comprising: a first piezoelectric element which generates a signal by warping the first piezoelectric element due to a vibration or impact applied thereto; a first amplifier circuit which amplifies the signal to produce an amplified signal and which is operationally connected to the first piezoelectric element; an instruction unit which determines an application of the amplified signal to the first piezoelectric element; a power supply circuit operationally connected to the first amplifier circuit; a second piezoelectric element which generates an electric power by warping the second piezoelectric element due to a vibration or impact applied thereto; and a second amplifier circuit operationally connected to the power supply circuit and the second piezoelectric element wherein the electric power is amplified by the second amplifier circuit to produce an amplified electric power.

In the above described structure, the sports implement further comprising a charging unit for storing electric power, that operationally connected to the power supply circuit.

One feature of the above-mentioned configuration is that further comprising a rectifier unit for rectifying the amplified signal prior to the application thereof to the first piezoelectric element.

In the above described structure, the first amplifier circuit is includes at least a TFT.

One feature of the above-mentioned configuration is that further comprising a display portion for displaying a result of the voltage application obtained in the instruction unit.

One feature of the above-mentioned configuration is that further comprising a receiving circuit including an antenna for receiving a signal voltage application to the first piezoelectric element.

One feature of each above-mentioned configuration is that further comprising a central processing unit.

One feature of each above-mentioned configuration is that further comprising a memory element.

One feature of each above-mentioned configuration is that the first piezoelectric element and the second piezoelectric element are warped by being applied to a vibration or impact to generate electric power, and the sports implement becomes warm or cool by the electric power.

In the above described structure, the sports implement is one of a hitting sports implement, a winter sports implement, a training wear, an insole, and shoes.

Another structure described in this specification is an amusement tool comprising: a piezoelectric element; an amplifier circuit operationally connected to the piezoelectric element; and a light emitting element, wherein the piezoelectric element is warped by being applied to a vibration or impact to generate electric power, and the light emitting element emits light using the electric power.

In the above described structure, the amplifier circuit includes at least a TFT.

One feature of each above-mentioned configuration is that further comprising a central processing unit.

In the above described structure, the amusement tool is one of a ball, a glove, and shoes.

Another structure described in this specification is a training tool comprising: a piezoelectric element; an amplifier circuit operationally connected to the piezoelectric element; and a receiving circuit including an antenna, wherein the piezoelectric element is warped by being applied to a vibration or impact to generate electric power, and the amplifier circuit and the receiving circuit are supplied with the electric power.

One feature of each above-mentioned configuration is that further comprising a central processing unit.

One feature of each above-mentioned configuration is that further comprising a memory element.

In the above described structure, the amplifier circuit includes at least a TFT.

In the above described structure, the training tool is one of a training machine, a training wear, a skiwear, a snowboardwear, and shoes.

BRIEF DESCRIPTION OF THE DRAWINGS

In the accompanying drawings:

FIGS. 2A and 2B are a cross sectional view and an equivalent circuit diagram of a piezoelectric element and a TFT, respectively (Embodiment Mode 1);

DETAILED DESCRIPTION OF THE INVENTION

Hereinafter, Embodiment Modes of the present invention will be described. Embodiment modes of the present invention are hereinafter described with reference to accompanying drawings. The present invention can be implemented in various modes. It is to be understood that various changes and modifications will be apparent to those skilled in the art, unless such changes and modifications depart from the spirit and scope of the present invention hereinafter defined. Therefore, the present invention is not limited to Embodiment Modes.

Embodiment Mode 1

Figure 1:
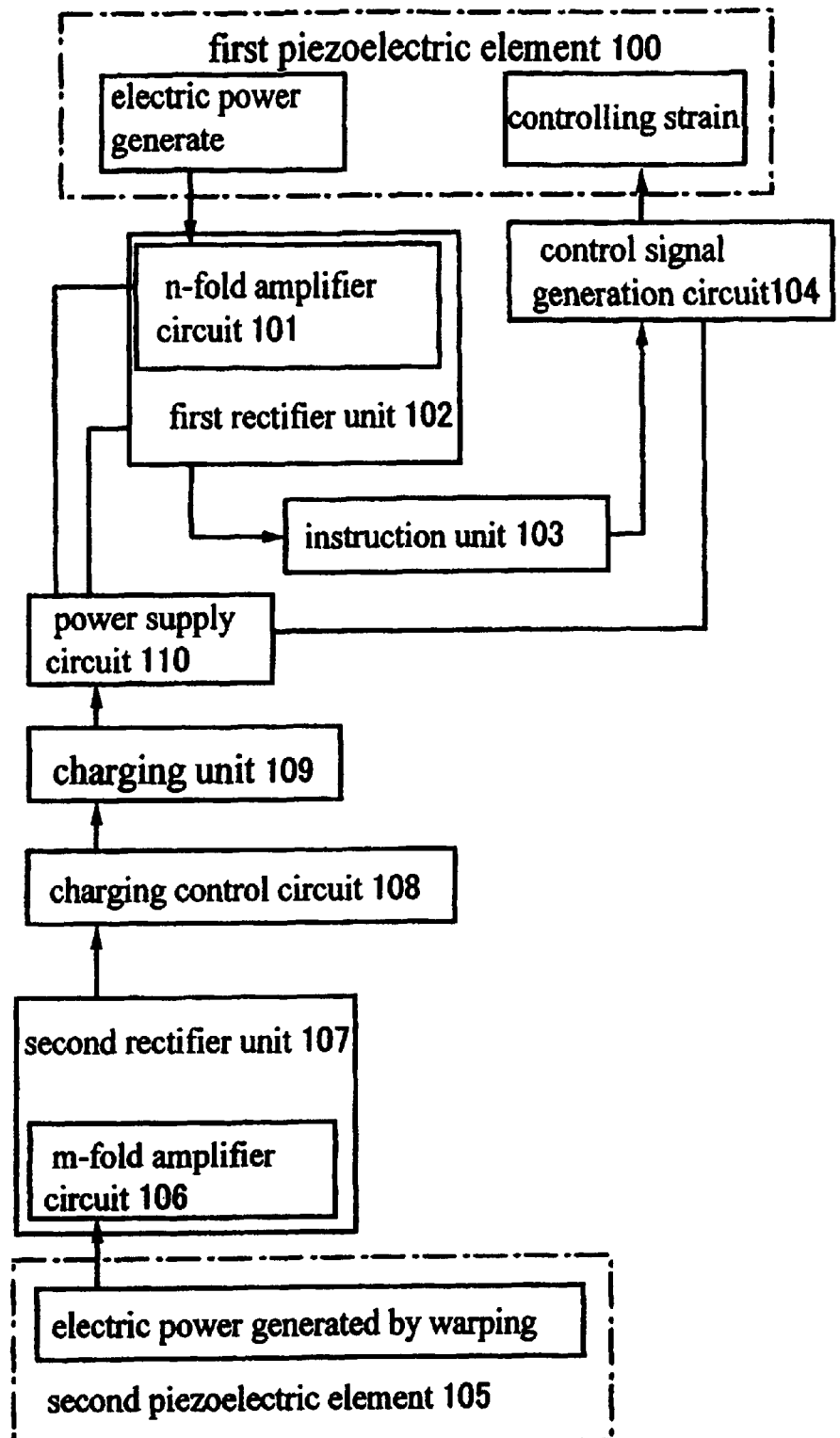
FIG. 1 is a block diagram showing Embodiment Mode 1.

FIG. 1 is a block diagram of a circuit and an element installed in a sports implement.

A plurality of piezoelectric elements are provided for a sports implement. Herein two piezoelectric elements (a first piezoelectric element 100 and a second piezoelectric element 105) are shown for simple explanation herein.

When a sports implement of a user is added with a vibration or an impact, strain is added to each piezoelectric element to generate electric power. Since the vibration or impact is converted into electric energy by a piezo effect, the vibration of the sports implement can be reduced.

Electric power generated in the first piezoelectric element 100 is rectified with a first rectifier unit 102. The first rectifier unit 102 is configured by using an amplifier circuit, a smoothing circuit, a waveform shaping circuit, a buffer amplifier, a switching circuit, a resistor and the like appropriately. At least an n-fold amplifier circuit 101 of the first rectifier unit 102 is formed from a TFT. Note that a TFT has a small current ability as an element, and thus, the element is needed to be large so as to enhance the current ability.

The smoothing circuit can include a resistor and a capacitor, and can be formed concurrently with manufacturing steps of a TFT. The waveform shaping circuit can be also formed by using an inverter using a TFT.

Figure 2A:
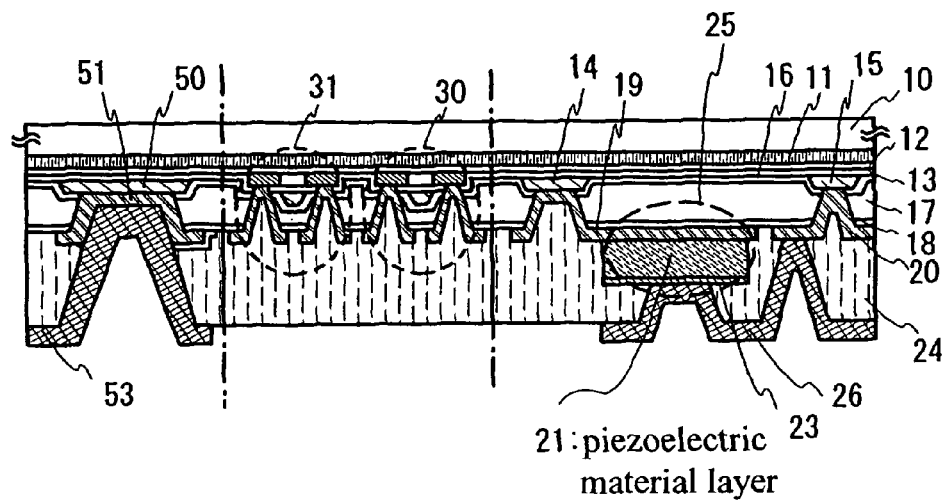
Figure 2A:
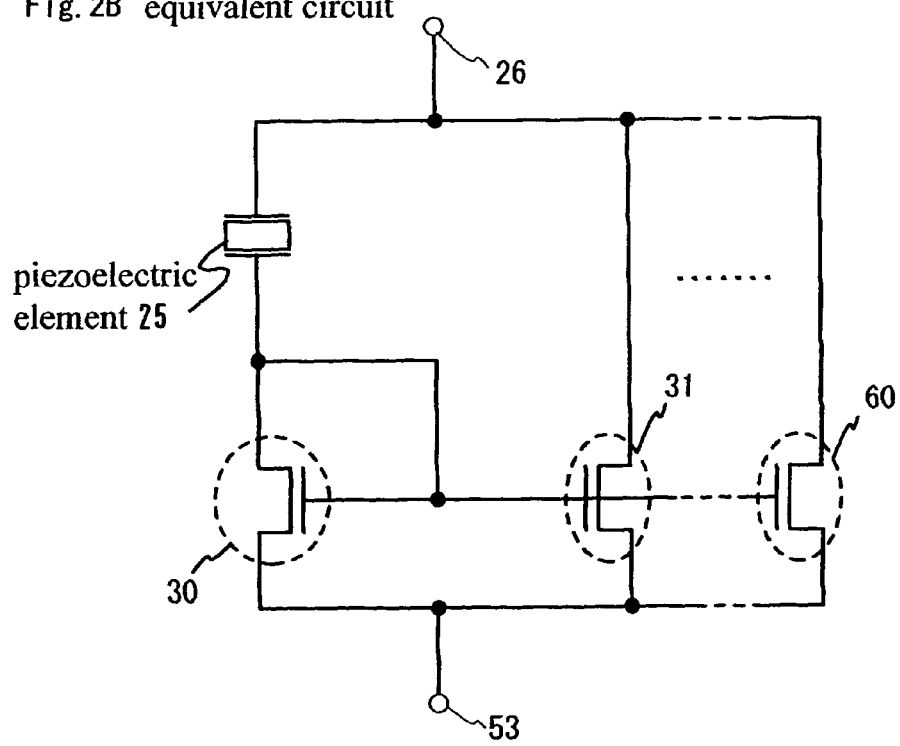

FIG. 2 shows one example in which an amplifier circuit using a TFT and a piezoelectric element are formed integrally. FIG. 2A shows a cross-sectional structure and FIG. 2B shows an equivalent circuit.

In FIG. 2A, reference numeral 10 denotes a film substrate, 11 denotes an adhesive layer, 12 denotes a base insulating film, and 13 denotes a gate insulating film. A vibration travels through the film substrate 10, the adhesive layer 11, and the base insulting film 12 and the gate insulating film 13. Thus, the materials of the film substrate 10, the adhesive layer 11, and the base insulting film 12 and the gate insulating film 13 are all preferably flexible. In addition, a plastic substrate (200 to 500 µm thick) is used as the film substrate 10. The film substrate 10 preferably has a low thermal expansion property.

A piezoelectric element 25 comprises a first electrode 23, a second electrode 19 and a piezoelectric material layer 21 interposed between the first electrode and the second electrode.

In addition, an amplifier circuit provided on the substrate to amplify output value of the piezoelectric element 25 comprises a current mirror circuit including n-channel TFTs 30, 31 and 60. In FIG. 2B, one n-channel TFT 30, a first n-channel TFT 31 and an X-th TFT 60, namely, in total (X+1) pieces TFT, are provided to obtain X-fold output. For example, one n-channel TFT 30 (channel size: L/W=8 µm/50 µm) and 100 (a first to a hundredth) n-channel TFTs (channel size: L/W=8 µm/50 µm) are provided to obtain 100-fold output. If two n-channel TFTs 30 are used, the two n-channel TFTs 30 and ten n-channel TFTs 31 are provided so that the output value becomes five times higher.

In order to amplify the output value further, the amplifier circuit may have an operational amplifier in which the n-channel TFT or the p-channel TFT is combined appropriately. In this case, however, the number of terminals is five. It is possible to decrease the number of terminals to four by decreasing the number of power supplies when the amplifier circuit has the operational amplifier and when a level shifter is used.

Although this embodiment mode shows an example in which the n-channel TFTs 30 and 31 are top-gate TFTs each having a single gate structure, they may have a double gate structure to reduce a variation. Furthermore, in order to decrease the off current value, the n-channel TFTs 30 and 31 may have an LDD (Lightly Doped Drain) structure. The LDD structure is a structure in which a region added with an impurity element at low concentration, which is referred to as an LDD region, is provided between the channel-forming region and a source region or a drain region formed by adding the impurity element at high concentration. The LDD structure has an advantageous effect of relaxing the electric field near the drain and preventing the deterioration due to the hot-carrier injection. Moreover, in order to prevent the lowering of the on-current value due to the hot carrier, the n-channel TFTs 30 and 31 may have a GOLD (Gate-drain Overlapped LDD) structure. The GOLD structure, which is a structure where the LDD region is disposed through the gate insulating film so as to overlap the gate electrode, has a higher advantageous effect of relaxing the electric field near the drain and preventing the deterioration due to the hot-carrier injection than the LDD structure. Thus, the GOLD structure is effective in preventing the deterioration by relaxing the electric field intensity near the drain and by preventing the hot-carrier injection.

A wiring 14 is connected to a first electrode 19 and extends into the channel-forming region of the TFT 30 of the amplifier circuit and therefore the wiring also serves as a gate electrode.

A wiring 15 is connected to a second electrode 23 and to a drain electrode or a source electrode of the TFT 31. Reference numerals 16 and 18 denote inorganic insulating films, 17 denotes an insulating film formed by a coating method, and 20 denotes a connection electrode.

A terminal electrode 50 is formed in the same process as the wirings 14 and 15. A terminal electrode 51 is formed in the same process as the electrodes 19 and 20.

In this way, noise can be reduced because a piezoelectric element and an amplifier circuit are formed on the same substrate. The output value can be amplified efficiently. In addition, other circuits can be made with a TFT, as well as an amplifier circuit. FIGS. 5A to 5D each show an example thereof.

Figure 5A:
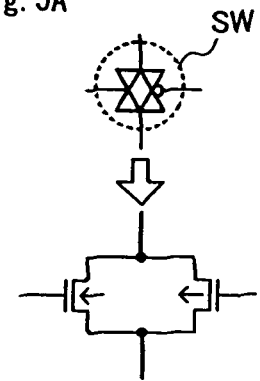
FIGS. 5A to 5D are each a circuit diagram showing Embodiment Mode 1.
Figure 5B:
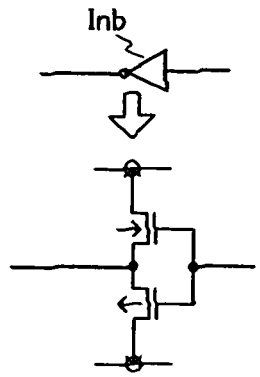
Figure 5C:
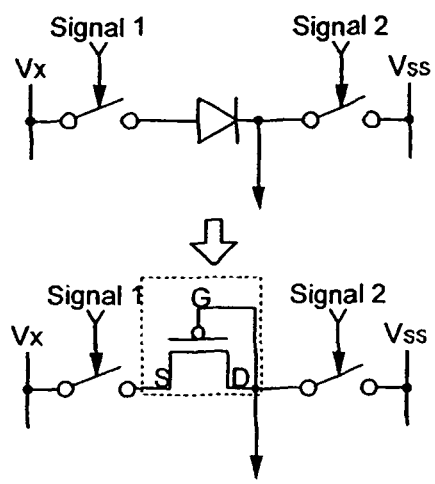
Figure 5D:
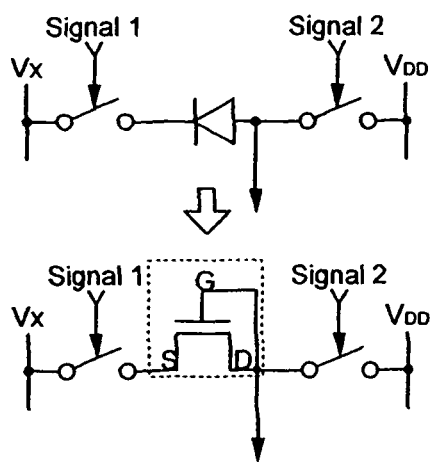

FIG. 5A shows an equivalent circuit of a switch circuit including a p-channel TFT and an n-channel TFT. FIG. 5B shows an equivalent circuit of an inverter circuit including a TFT. FIG. 5C shows an equivalent circuit of a circuit including a p-channel TFT in which a rectification element is diode-connected in the circuit in which two switching elements and the rectification element are used together. FIG. 5D shows an equivalent circuit of a circuit including an n-channel TFT in which a rectification element is diode-connected in the circuit in which a switching element and the rectification element are used together.

An instruction unit 103 is provided with a switch and this switch is a switch which is turned on by temperature, pressure or a signal from the outside, a switch operated by a man and the like. Herein, the instruction unit 103 is an instruction unit for switching a signal switch on and off freely by a user. If a user makes the signal switch on, a control signal is formed by a control signal generation circuit 104 and the signal is supplied to the first piezoelectric element 100 to control the strain of a sports implement. That is to say, the control signal generation circuit 104 forms an electric signal to produce a vibration in the antiphase canceling a wavelength generated by the vibration or impact on the sports implement.

Therefore, a piezoelectric material having characteristics of recovering the shape of the piezoelectric element by the electric signal is preferably used as a piezoelectric material of the first piezoelectric element 100. In addition, it is preferable that the first piezoelectric element 100 is as large as possible when the characteristics of a sports implement are changed drastically, since the first piezoelectric element 100 varies characteristics thereof by recovering the shape of the piezoelectric element.

When a user turns off the signal switch, a signal for controlling strain is not formed.

In this way, sports implement having two-types behaviors can be provided by switching on and off of a signal switch by a user.

The present invention is not limited to the two types of behaviors. If a circuit (e.g., a CPU or the like) by which fine regulation can be conducted at more multiples stages is installed, a user can adjust characteristics of a sports implement at multiples stages.

According to the present invention, operation can be conducted without power supply from the outside, since a charging portion is included. Electric power generated in the second piezoelectric element 105 is rectified with a second rectifier unit 107. The second rectifier unit 107 comprises an amplifier circuit, a smoothing circuit, a waveform shaping circuit, a buffer amplifier, a switching circuit, a resistor, and the like appropriately. At least an m-fold amplifier circuit 106 of the second rectifier unit 107 is formed by using a TFT.

A charging control circuit 108 and a charging unit 109 are charged with pulsating flow obtained by the second rectifier unit 107 as a direct current. A secondary battery is preferable for the charging unit 109. Voltage adjustment of each circuit is performed in a power supply circuit 110 using the electric power supplied from the charging unit 109.

If the switch of the instruction unit 103 is off, the electric power generated by the first piezoelectric element 100 may be stored in the charging unit 109 in order to secure much more electric power.

Since the second piezoelectric element 105 only generates electric power, the second piezoelectric element 105 may be smaller than the first piezoelectric element if the magnification of the amplifier circuit 106 is increased. A piezoelectric material having characteristics of recovering the shape of the piezoelectric element by the electric signal is not particularly needed for the second piezoelectric element 105, unlike the first piezoelectric element, and a piezoelectric material different from that of the first piezoelectric element may be used for the second piezoelectric element 105.

Embodiment Mode 2

An example of installing a display portion in a sports implement to display on and off by the instruction unit is shown in Embodiment Mode 2. A block diagram is shown in FIG. 3.

Figure 3:
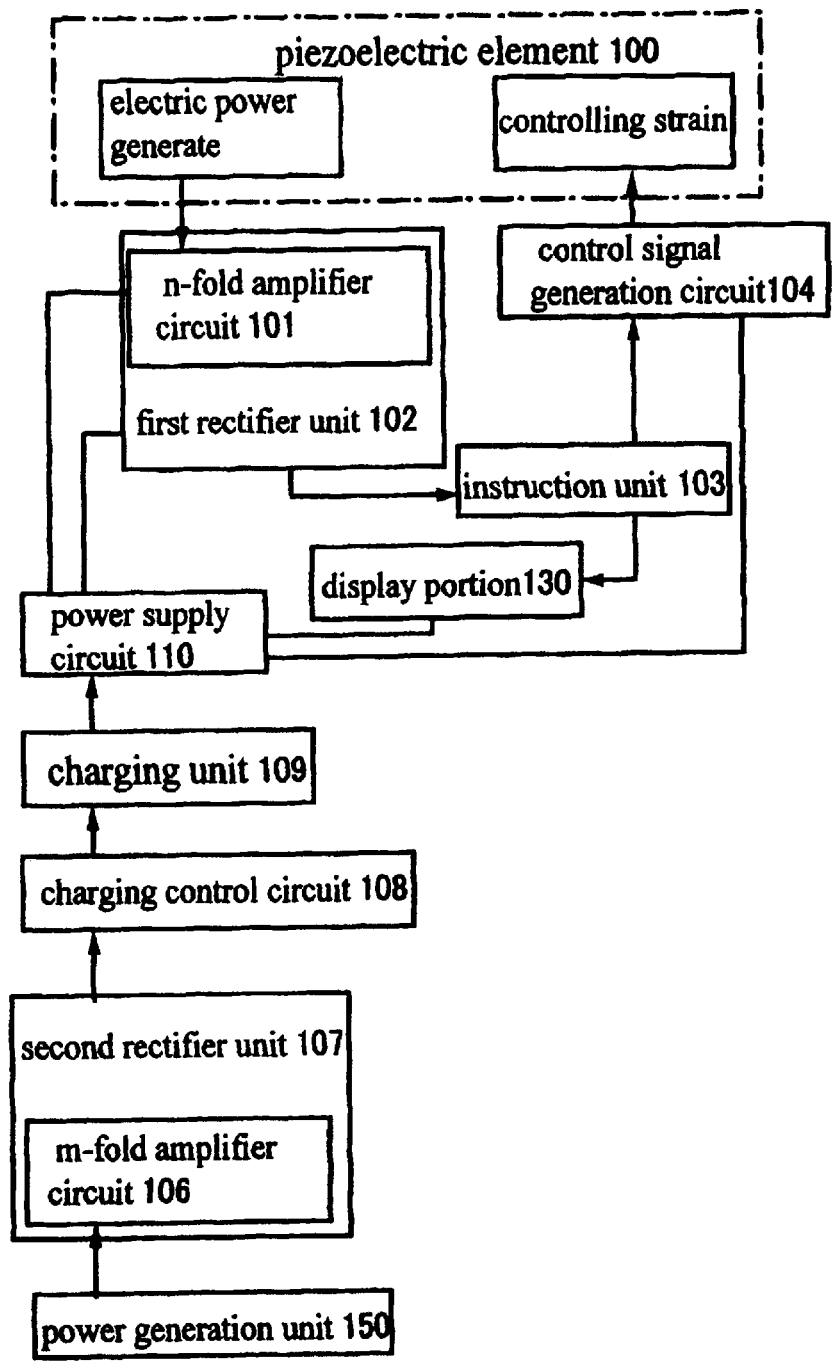
FIG. 3 is a block diagram showing Embodiment Mode 2.

FIG. 3 is similar to FIG. 1 except that a display portion 130 and a power generation unit 150 are provided. Thus, detailed description of the same elements is omitted. Note that the same elements in FIG. 3 as those in FIG. 1 are denoted by the same reference numerals.

For the display portion 130, a display device using an electroluminescence element (an EL element) is preferable. If an active matrix display device using an electroluminescence element is employed, it can be formed integrally on the same substrate as an amplifier circuit and installed in a sports implement. The display device to be installed may be a passive matrix display device when the display device may be used for simple monochrome display or display of figures only.

A photovoltaic device (such as solar battery) or a thermo electric generator (such as Seebeck element) may be used for the power generation unit 150 without limiting to the piezoelectric element. A plurality of kinds of power generators may be installed in a sports implement. A solar battery using amorphous silicon can be formed integrally on the same substrate as the amplifier circuit and installed in a sports implement.

This embodiment mode can be freely combined with Embodiment Mode 1.

Embodiment Mode 3

As for a sports implement which is difficult in installing a display portion or an instruction unit, a sports implement is provided with a transmitting circuit and receives a signal from a receiving circuit formed in an external terminal and thus the display may be confirmed by the external terminal.

An example of installing a receiving circuit in a sports implement is shown in Embodiment Mode 3. A block diagram is shown in FIG. 4.

Figure 4:
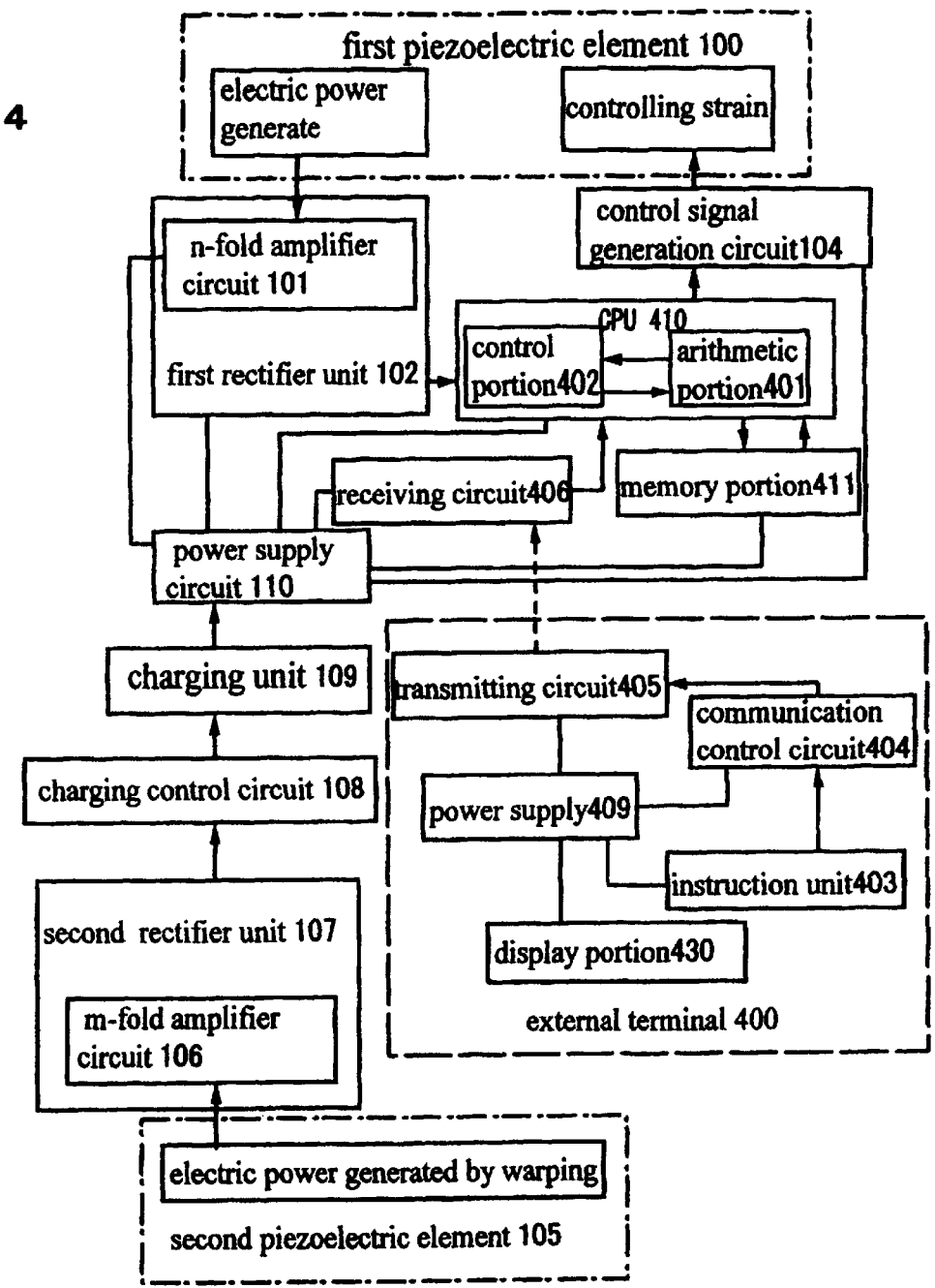
FIG. 4 is a block diagram showing Embodiment Mode 3.

FIG. 4 is the same as FIG. 1 except that a receiving circuit 406, a CPU 410 and a memory portion 411 are provided and an external terminal 400 is used. Thus, the detailed description of the same elements is omitted. Note that the same elements in FIG. 4 as those in FIG. 1 are shown by the same reference numerals.

A flow of adjustment by remote-controlling of a sports implement using an external terminal 400 is described. A person (including a user) who wants to change characteristics of a sports implement selects desired setting with an instruction unit 403 formed in an external terminal 400 and a signal is transmitted. The signal is transmitted to the receiving circuit 406 provided in a sports implement from a transmitting circuit 405 through a communication control circuit 404.

The desired setting can be confirmed in a display portion 430. Reference numeral 409 denotes a power supply of the external terminal 400 which supplies power to each circuit of the external terminal 400.

The signal is received by the receiving circuit 406 and processing is conducted in the central processing unit 410 to rewrite setting of the memory portion 411 based on the signal. A signal is generated based on the rewritten setting of the memory portion 411 and strain is controlled.

Note that reference numeral 410 denotes a central processing unit (CPU), 402 denotes a control portion, 401 denotes an arithmetic portion and 411 denotes a memory portion (memory) in FIG. 4.

The central processing unit 410 comprises the arithmetic portion 401 and the control portion 402. The arithmetic portion 401 includes an arithmetic logic unit (ALU) that conducts an arithmetic operation such as addition or subtraction, or a logical operation such as AND, OR or NOT, various registers that temporarily store data or the results of the operations, a counter that counts the number of inputted 1, and the like. A circuit for the arithmetic portion 401, such as an AND circuit, an OR circuit, NOT circuit, a buffer circuit, or a register circuit can be formed by using a TFT. A semiconductor film crystallized by continuous wave laser light may be formed as an active layer of a TFT to obtain a high electron field-effect mobility.

The control portion 402 has a function of carrying out an instruction stored in the memory portion 411 and controlling the entire operation. The control portion 402 comprises a program counter, an instruction register, and a control-signal generating portion. In addition, the control portion 402 can be also formed by using a TFT, too and may be formed by using the crystallized semiconductor film as an active layer of the TFT.

The memory portion 411 stores data and an instruction for an operation, and stores data or a program that is frequently conducted in the CPU. The memory portion 411 comprises a main memory, an address register and a data register. A cache memory may be employed in addition to the main memory. These memories may be a SRAM, a DRAM, a flash memory or the like. If the memory portion 411 is also formed by using a TFT, a crystallized semiconductor film can be used as an active layer of the TFT.

Initially, a tungsten film and a silicon oxide film are formed by a sputtering method over a glass substrate, a base insulating film (a silicon oxide film, a silicon nitride film or a silicon oxynitride film) is formed thereover, and an amorphous silicon film is formed thereover. In a later step, a separation is conducted by using a tungsten oxide film formed between the tungsten film and the silicon oxide film.

The following methods may be used for crystallization: a method of adding a metal element serving as a catalyst to an amorphous silicon film, heating it to obtain a polysilicon film and obtaining a more crystallized polysilicon film by being irradiated with pulsed laser light; a method of emitting continuous wave laser light on an amorphous silicon film to obtain a polysilicon film; a method of heating an amorphous silicon film to obtain a polysilicon film and emitting continuous wave laser light onto the polysilicon film to obtain a more crystallized polysilicon film; and a method of adding a metal element serving as a catalyst to an amorphous silicon film, heating it to obtain a polysilicon film and obtaining a more crystallized polysilicon film by being irradiated with continuous wave laser light. Thereafter, a TFT is completed by using a known technique.

In this way, the memory portion or the CPU is configured by a TFT using the thusly obtained polysilicon film as an active layer, a layer to be peeled including the CPU or the memory portion is separated from the glass substrate and transferred onto a plastic substrate. If such a CPU can be installed, a variety of settings in a sports implement are possible.

Another power generation unit may be provided instead of the second piezoelectric element 105. For example, a photovoltaic device (such as solar battery) or a thermo electric generator (such as Seebeck element) may be used. A plurality of kinds of power generators may be installed in a sports implement. A solar battery using amorphous silicon can be formed integrally on the same substrate as an amplifier circuit and installed in a sports implement.

This embodiment mode can be freely combined with Embodiment Mode 1 or 2.

The present invention having above-mentioned structures is described more in detail in embodiments hereinafter.

Embodiment 1

Figure 6:
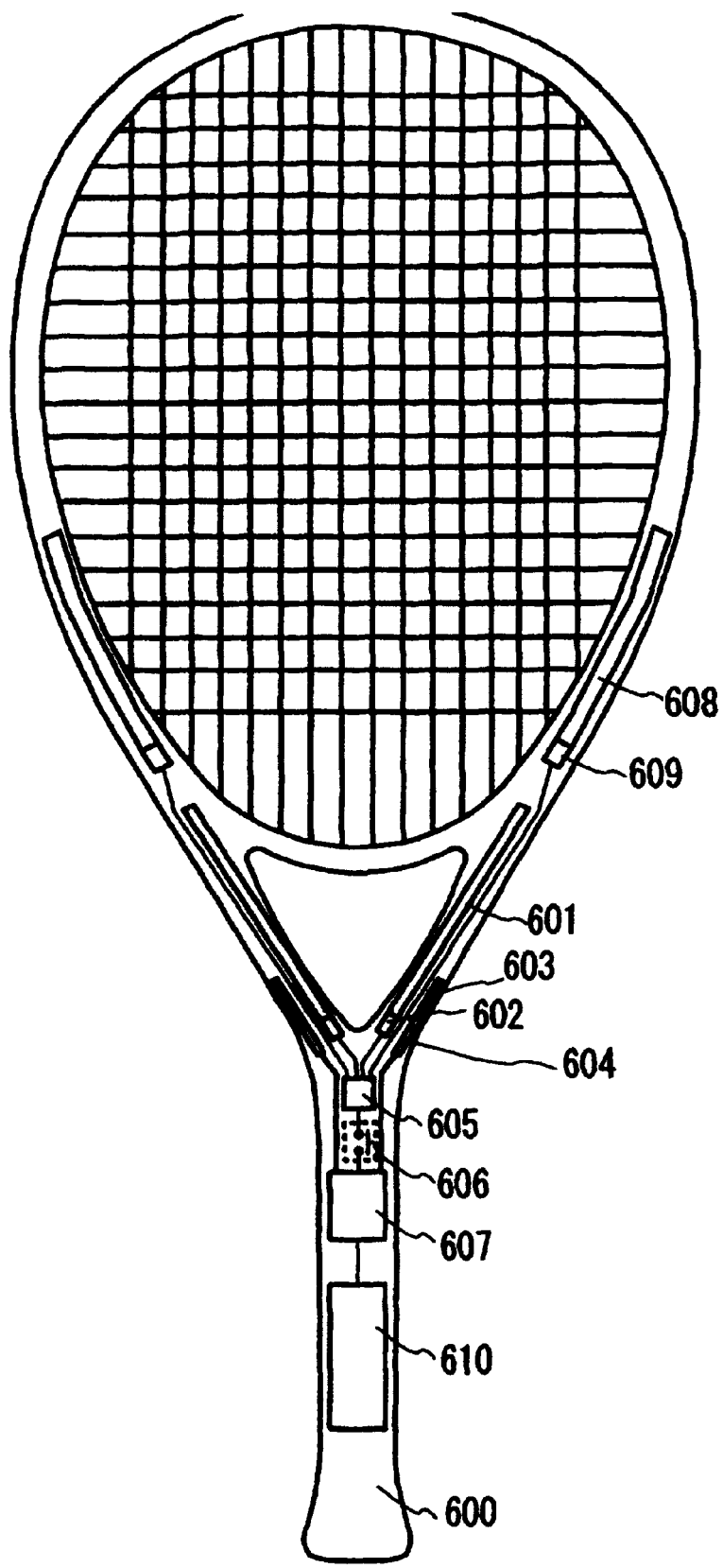
FIG. 6 shows an example of a sports implement (Embodiment 1)

In Embodiment 1, an example in which the present invention is applied to a tennis racket as an example of a sports implement for hitting a ball is shown in FIG. 6.

Since a circuit is configured by a TFT provided on a flexible plastic film, the circuit can be attached and installed in a portion having a free shape, for example, a curved portion, a slim portion or the like. Therefore, the circuit can be provided for a thin part of a frame without limiting to the grip of the racket. Various circuits including TFTs can be arranged since an installation space can be secured. Here, the circuit is provided in only a part of the frame, but the circuit can be arranged in many portions, e.g., the entire frame.

A piezoelectric element and a circuit including a TFT can be integrally formed. When they are integrally formed, superimposing of noise can be prevented.

Specifically, piezoelectric elements 601, 603 and 608 are provided for a plurality of portions and amplifier circuits 602, 604 and 609 including TFTs are installed in the frame portion as shown by an example in FIG. 6. Such circuits may be installed inside the frame, or attached onto the frame and covered with a protective film. In addition to the amplifier circuit, other rectifier units, e.g., a smoothing circuit, a waveform shaping circuit, a buffer amplifier, a switching circuit, a resistor or the like may be integrally formed with the amplifier circuit.

In a grip portion, a switch 606, a control signal generation circuit 605, an integrated circuit (a power supply circuit, a memory, a CPU, a receiving circuit or the like) 607 including a TFT and a battery (preferably, the second battery which is rechargeable) 610 are provided for the grip portion. A rectifier unit, e.g., a smoothing circuit, a waveform shaping circuit, a buffer amplifier, a switching circuit, a resistor or the like may be formed integrally with the integrated circuit 607. Note that the block diagram may be referred to FIG. 1 or FIG. 4.

Mechanical energy of an impact from a ball is changed into electric energy by the piezoelectric elements 601, 603 and 608, and the electric energy is amplified by the amplifier circuits 602, 604 and 609. The amplifier circuit can be provided in contact with or in the periphery of the piezoelectric element by being configured by a plastic film TFT. Therefore, the electric power generated in the piezoelectric element can be amplified immediately, and used.

The first piezoelectric elements 601 and 608 also serve to control strain of the frame by a signal from the control signal generation circuit 605. The amplification factors of the amplifier circuits 602 and 609 are preferably 2 times or more, preferably 10 to 50 times. Note that the control signal generation circuit 605 generates an electric signal to produce vibration of the antiphase canceling a wavelength generated by the vibration or impact on the racket In this embodiment, a second piezoelectric element 603 to ensure electric power and an amplifier circuit 604 having a large amplification factor, e.g., the 100-fold amplification factor are provided to install various circuits in the racket. The second piezoelectric element 603 may be small, and may be formed by using a piezoelectric material or an element structure higher in conversion efficiency than the first piezoelectric element.

For example, when a tennis racket of FIG. 6 is used, setting at two stages can be employed: neutral setting that a switch 606 is turned off and plus setting that the switch 606 is turned on to supply a signal from the control signal generation circuit 605 to the first piezoelectric elements 601 and 608 to control strain of the frame and the stiffness of the frame is enhanced.

In the neutral setting, vibration of the racket is reduced by converting the vibration or impact to electric energy by the piezoelectric effects of the piezoelectric elements 601, 603 and 608. Note that, in neutral setting, the second piezoelectric element 603 immediately amplifies and rectifies the generated electric power and charges the battery 610 with the electric power.

In the plus setting, a vibration or impact is converted to electric energy by the piezoelectric effects of the piezoelectric elements 601 and 608 to control strain of a part of the frame provided with the piezoelectric elements 601 and 608 by using the electric energy. A signal for controlling the strain of the frame is formed in the control signal generation circuit 605 or the integrated circuit 607. Electric power is supplied to each circuit from the battery 610.

Setting of a racket can be selected based on the intention of a user by switching the switch 606 provided in the racket by the user. Therefore, two types of returning balls are possible by changing the setting of a racket, even if the user does not change physical strength in swinging.

In the case of the plus setting, the stiffness of a frame is enhanced, and a user can return a high speed ball with small power and high speed by controlling the speed, even if the coming ball is fast or slow. In the plus setting, a contact time with a ball is short and the ball is not easily spun since the frame has high stiffness. Therefore, in the plus setting, a user needs a technique for spinning a ball in returning. Further, the user also needs a technique for returning a slow ball when the coming ball is fast.

If a user wants to spin the ball in returning, he/she selects the neutral setting and lengthen the contact time with the ball, thereby realizing high speed spinning and controlling the direction of the retuning ball. The user can return a slow ball by selecting the neutral setting and slowing down the speed of the fast ball.

Conventionally, a user needs high technique for returning various types of balls with one racket, but the user can return various types of balls with a racket according to the present invention even if the user does not have such high technique.

Since various types of balls can be returned even if the user's form or power is not changed, an opponent can hardly read the returning ball and the user can play a game dominantly.

As for a conventional racket, a professional player change a racket in the middle of a game in many cases since the tension of strings falls down as the racket is used more. If a racket according to the present invention is used, the same level response can be maintained by selecting the plus setting, even if the tension of strings falls down in the neutral setting by more use of the racket.

The switch 606 is not limited to the two-stage setting. If a CPU or a memory by which fine adjustment can be conducted at more stages is incorporated in the integrated circuit 607, a user can set a racket freely and return a ball as he/she wants to. If a technique as claimed in Japanese Patent Laid-Open No. 2003-174153 is employed, a memory or a CPU can be formed by using a TFT and formed on a plastic film.

An integrated circuit 607 incorporating a CPU and a memory may be attached or removed freely. A racket can be set by attaching or removing the integrated circuit 607 incorporating a CPU and a memory.

This embodiment can be freely combined with any one of Embodiment Modes 1 to 3. For example, this embodiment is combined with Embodiment Mode 2, and a simple display portion may be provided in the racket 600 so that a user can recognize the present state of the racket. In addition, an integrated circuit 607 incorporating a power generation unit such as a solar battery may be provided. A contactless power transfer module that can charge electric power without contact may be provided in a racket 600, since it does not require replacement of the battery 610.

This embodiment is combined with Embodiment 3, and a receiving circuit may be incorporated in the integrated circuit 607, and a signal from an external terminal (not shown) including a transmitting circuit is received and processed in the integrated circuit 607, thereby making it possible to set a racket. If the setting of a racket 600 can be changed by the external terminal, the structure of the racket can be simple without providing a switch for the racket 600.

Embodiment 2

Figure 7:
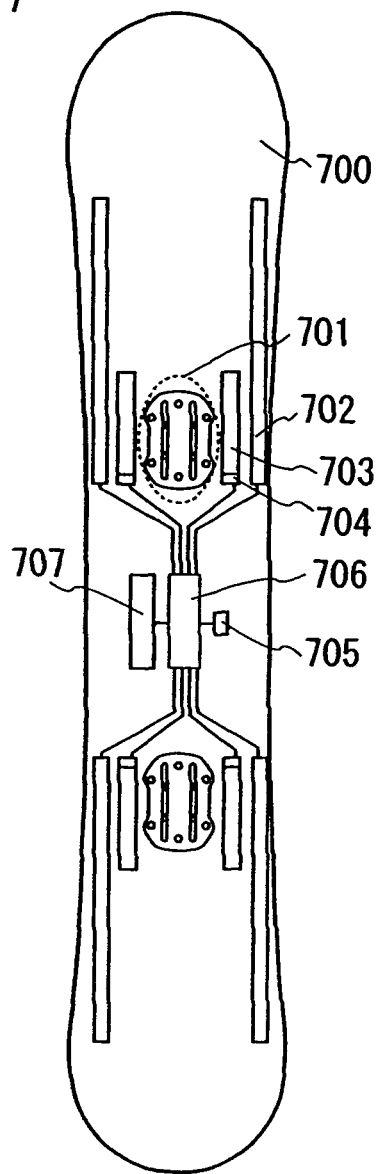
FIG. 7 shows an example of a sports implement (Embodiment 2)

In Embodiment 2, an example in which the present invention is applied to a snowboard as an example of a winter sports implement is shown with reference to FIG. 7.

As for a conventional snowboard, a user can only set a stance width and an angle, and a flexibility of a snowboard, namely, stiffness is different depending on boards. Therefore, snowboards having various flexibilities are prepared in shops.

Conventionally, a user must buy a snowboard having little flexibility if the user needs a hard snowboard, and a snowboard having more flexibility if the user needs a soft snowboard.

Actually, the needed flexibility is different depending on snow quality or application, for example, if the snow is light, a more flexible snowboard is needed and superior in an operational property in snowboarding, and if the snow is heavy, a hard snowboard is superior in stability in snowboarding.

As for snowboarding, various types of snowboarding sports, e.g., snowboarding on a metal tube called a rail or over a box-type obstacle called a box, are conducted in recent years, as well as a half pipe or jump in snowboarding. A hard snowboard in less flexibility is superior in stability in a half pipe, jump or a rail.

However, when using a hard snowboard, if a user must warp the board in snowboarding by the user's weight, more weight is needed than when using a soft snowboard, and thus, a user that has weak muscle or an unskilled user has difficulties in handling a hard snowboard. It is commonly said that a soft snowboard is suitable for a beginner and a hard snowboard is suitable for the experienced. That is to say, as a user improves his/her skill in snowboarding, the flexibility of a board suitable for the user is also changed, and thus, the user buys a new snowboard in each case.

According to the present invention, as shown by an example of FIG. 7, it is possible for a user to adjust the flexibility of a snowboard by installing an integrated circuit such as piezoelectric elements 702 and 703 or an amplifier circuit 704 including a TFT is a snowboard 700. Such elements may be installed inside the board or attached onto the board and covered with a protective film.

Conventionally, a user must change a board as he/she improves the skill. However, if a user uses a snowboard according to the present invention, the flexibility of the snowboard can be adjusted according to the improvement of the user's skill and a board suitable for each user can be provided. Further, the flexibility of the snowboard can be freely adjusted in accordance with snow quality or application, by using a snowboard according to the present invention.

Specifically, a first piezoelectric element 702 is provided in a portion of a board that is to be hard, typically, in the vicinity of an edge, and a second piezoelectric element 703 is provided in a portion of a board that is most easily deformed, typically, in the vicinity of a position 701 where a binding is set. The second piezoelectric elements 703 are provided symmetrically on the both of the toe and heel sides with the binding setting position 701 interposed between the second piezoelectric elements 703. Four piezoelectric elements 703 are disposed at four positions, but the arrangement or the number thereof is not limited thereto. A snowboard is so wide that a circuit can be arranged at any position. Mechanical energy produced due to transformation of a board by vibration or an impact from a snow surface in snowboarding is changed into electric energy with the piezoelectric element 703, and the electric energy is amplified in the amplifier circuit 704. The amplifier circuit 704 is configured by a plastic film TFT, and thus, the amplifier circuit 704 can be provided in contact with or in the vicinity of the second piezoelectric element. Therefore, the electric power generated in the second piezoelectric element can be amplified immediately, and used.

The generated electric power is immediately amplified and rectified in the integrated circuit 706 including a TFT, and further stored in a battery 707.

In addition, an instruction unit 705 includes a switch, and this switch is a switch which is turned on by temperature, pressure or a signal from the outside, a switch operated by a man, and the like. Herein, the instruction unit 705 is an instruction unit for switching a signal switch on and off freely by a user.

If a user turns the signal switch on, electric power is supplied from a battery and a signal for controlling strain of a board is generated in an integrated circuit (such as a power supply circuit, a control signal generation circuit, a memory, a CPU, or a receiving circuit) and the signal is supplied to the first piezoelectric element 702. The first piezoelectric elements 702 are provided symmetrically on the toe and heel sides with the binding setting position 701 interposed between the second piezoelectric elements 702. The first piezoelectric element 702 is arranged closer to an edge than the piezoelectric element 703, and four piezoelectric elements 702 are disposed at four positions, but the arrangement or the number thereof is not limited thereto. An electric signal to produce vibration of the antiphase canceling a wave generated by the vibration or impact onto the board is supplied to the first piezoelectric element 702. In this way, a user can harden a board by turning a signal switch on.

Muscle strengths of the right leg and the left leg are different commonly, and different signals may be supplied to the first piezoelectric element on the right side and to the first piezoelectric element on the left side, thereby making the stiffness in the vicinity of the right foot and the stiffness in the vicinity of the left foot of the board different. By changing each stiffness of the board in accordance with muscle strengths of the right and left legs by a user, the identical warp in the right and left skies is obtained and the user can do a symmetrical turn even if difference weights are put on by the right and left legs.

The stiffness on the toe side and the heel side may be different by supplying different signals to the first piezoelectric element on the toe side and the first piezoelectric element on the heel side, respectively. A board is easily twisted when weight is put thereon, namely, the torsion becomes large, and thus a curve can be easily made with low weight.

When a TFT is driven, it generates heat. Heat is generated by driving the integrated circuit 706 or the amplifier circuit 704 including a TFT. The sole surface may be heated indirectly by the generated heat and thus the friction resistance with the snow face is reduced, thereby increasing the snowboarding speed.

A heating element (such as a resistor) may be provided instead of the first piezoelectric element. For example, the stiffness of the board may be reduced by softening a material in the vicinity of the portion that has been heated by heating a portion of the board having high stiffness entirely. Resin used in one layer of the board is a material that can be softened by heating. The friction resistance with the snow face may be reduced by heating the board by using a heating element, thereby increasing the snowboarding speed. It should be noted that it is difficult to change the setting of a board instantly, since the flexibility of the board is enhanced by heating by turning a switch on if a heating element is provided.

A snowboard has a structure of stacked layers and the circuits 706 and 704 including TFTs that are sheet-like may be provided as one layer thereof.

This embodiment can be freely combined with any one of Embodiment Modes 1 to 3. For example, this embodiment is combined with Embodiment Mode 2, and a simple display portion may be provided in the snowboard 700 so that a user can recognize the present state of the snowboard. In addition, an integrated circuit 706 incorporating a power generation unit such as a solar battery may be provided. A contactless power transfer module that can charge electric power without contact may be provided in the snowboard 700, since it does not require replacement of the battery 707.

This embodiment is combined with Embodiment 3, and a receiving circuit may be incorporated in the integrated circuit 706, and a signal from an external terminal (not shown) including a transmitting circuit is received and processed in the integrated circuit 706, thereby changing the setting of the snowboard. If the setting of the snowboard 700 can be changed by an external terminal, the appearance of the snowboard can be simple without providing a switch for the snowboard 700.

Embodiment 3

Figure 8A:
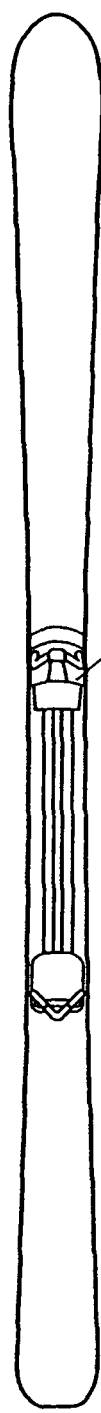
FIGS. 8A and 8B show an example of a sports implement (Embodiment 3).
Figure 8B:
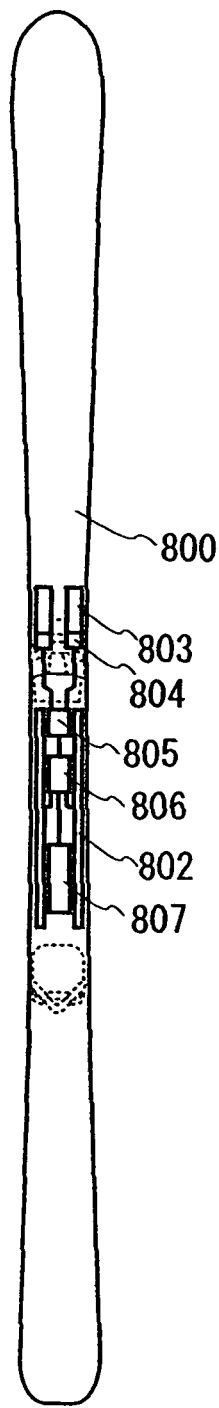

In Embodiment 3, an example in which the present invention is applied to a pair of skies as an example of a winter sports implement is shown in FIGS. 8A and 8B. FIG. 8A is a top view of one side of a pair of skies and FIG. 8B is a schematic diagram showing a circuit layout in the backside on one side of the skies.

As for a conventional ski, a user can set only a binding position, a fixing intensity of boots in a binding, and a flexibility of a ski, namely, stiffness is different depending on boards. Therefore, skis having various flexibilities are prepared in shops.

In this embodiment, as shown by an example of FIGS. 8A and 8B, it is possible for a user to adjust the flexibility of a ski by installing an integrated circuit such as piezoelectric elements 802 and 803 or an amplifier circuit 804 including a TFT is the ski 800. Such elements may be installed inside the board or attached onto the board and covered with a protective film.

The ski has a structure of stacked layers and the circuits 806 and 804 including TFTs that are sheet-like may be provided as one layer thereof.

Specifically, a first piezoelectric element 802 is provided in a portion of a board that is to be hard, typically, in the vicinity of an edge, and a second piezoelectric element 803 is provided in a portion of a board that is most easily deformed, typically, in the vicinity of a position 801 where a binding is set. The second piezoelectric elements 803 are provided symmetrically on the big toe and small toe (right and left) sides with the binding setting position interposed between the second piezoelectric elements 803. Four piezoelectric elements 803 are disposed at four positions in one pair of skies, but the arrangement or the number thereof is not limited thereto. Mechanical energy produced due to transformation of a board by vibration or an impact from a snow surface in skiing is changed into electric energy with the piezoelectric element 803, and the electric energy is amplified in the amplifier circuit 804. The amplifier circuit 804 is configured by a plastic film TFT, and thus, the amplifier circuit 804 can be provided in contact with or in the vicinity of the second piezoelectric element. Therefore, the electric power generated in the second piezoelectric element can be amplified immediately, and used.

The generated electric power is immediately amplified and rectified in the integrated circuit 806 including a TFT, and further stored in a battery 807.

In addition, an instruction unit 805 includes a switch, this switch is a switch which is turned on by temperature, pressure or a signal from the outside, a switch operated by a man and the like. Herein, the instruction unit 805 is an instruction unit for switching a signal switch on and off freely by a user.

If a user makes the signal switch on, electric power is supplied from a battery and a signal for controlling strain of a board is generated in an integrated circuit (such as a power supply circuit, a control signal generation circuit, a memory, a CPU, or a receiving circuit) 806 and the signal is supplied to the first piezoelectric element 802. An electric signal to produce vibration of the antiphase canceling a wave generated by the vibration or impact on the ski is supplied to the first piezoelectric element 802. In this way, a user can harden a ski by making a signal switch on.

Muscle strengths of the right leg and the left leg are different commonly, and different signals may be supplied to the first piezoelectric element on the right ski and to the first piezoelectric element on the left ski, thereby making the stiffness of the right ski and the stiffness of the left ski different. By changing each stiffness of the board in accordance with muscle strengths of the right and left legs by a user, the identical warp in the right and left skies is obtained and the user can do a symmetrical turn even if difference weights are put on by the right and left legs.

When a TFT is driven, it generates heat. Heat is generated by driving the integrated circuit 806 or the amplifier circuit 804 including a TFT. The sole surface may be heated indirectly by the generated heat and the friction resistance with the snow face is reduced, thereby increasing the skiing speed.

A heating element (such as a resistor) may be provided instead of the first piezoelectric element 802. For example, the stiffness of the ski may be reduced by softening a material in the vicinity of the portion that has been heated by heating a portion of the ski having high stiffness entirely. Resin used in one layer of the ski is a material that can be softened by heating. The friction resistance with the snow face may be reduced by heating the ski using a heating element, thereby increasing the skiing speed. It should be noted that it is difficult to change the setting of a ski instantly, since the flexibility of the ski is enhanced by heating with a switch turned on if a heating element is provided.

This embodiment can be freely combined with any one of Embodiment Modes 1 to 3.

Embodiment 4

Figure 9A:
FIGS. 9A and 9B show an example of a sports implement (Embodiment 4).
Figure 9B:
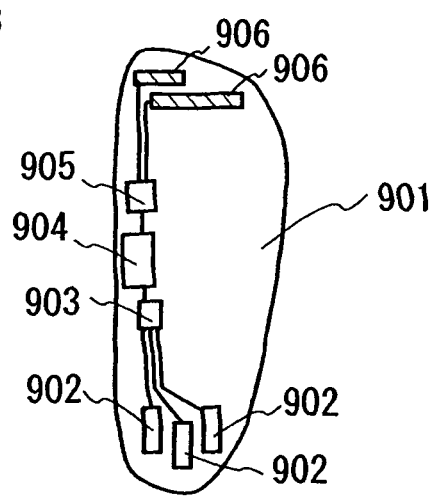

In Embodiment 4, an example in which the present invention is applied to snowboard boots as an example of a winter sports implement is shown in FIGS. 9A and 9B. FIG. 9A shows the appearance of boots and FIG. 9B is a schematic diagram showing a circuit layout in a sole portion of the boots.

In this embodiment, a piezoelectric element 902 is provided in a sole portion 901 of boots 900, and mechanical energy of an impact from the surface of the snow or a board is changed into electric energy with the piezoelectric element, and the electric energy is used. Impact absorption is done effectively by providing the piezoelectric element 902 in the sole portion 901 of the boots.

By using heat generated by driving a TFT, circuits 903, 905 and 906 including TFTs are arranged in the sole portion of the boots 900 to warm feet. The circuits including TFTs are thin, and sheet-like devices that each uses a flexible film as a base material. Thus, a user does not feel uncomfortable with the feet. Note that the circuit 903 including a TFT is a rectifier unit including an amplifier circuit, the circuit 905 including a TFT is a temperature control generation circuit including a CPU and a temperature sensor, and the circuit 906 including a TFT is a circuit generating heat, a serpentine wiring or a heat-generating element. The electric power generated in the piezo electric element 902 may be charged in a charging portion 904.

As shown in FIG. 9A, the circuits 903 and 905 including TFTs are arranged in the sole portion 901 of boots, preferably a shank portion in which an arrangement space can be secured, the circuit 906 including a TFT arranged in the toe portions of the boots generates heat using electric power obtained by vibration or impacts to the piezoelectric element 902 arranged in the heel portion of the sole portion, thereby warming the toes that are easily chilled or preventing heat radiation to the outside by a rapid temperature change. An insole having a piezoelectric element and a circuit including TFT may be arranged in boots instead of being incorporated directly in the boots themselves in manufacturing.

The electric power generated in the piezoelectric element is stored in the charging portion 904 and an instruction unit (not shown) is provided for a boot outer surface, and the fixation degree or stiffness in a portion covering a foot excluding its bottom may be adjusted under a CPU control by switching with an instruction of a user.

The present invention can be applied to ski boots, thermal boots and the like without limiting to snowboard boots shown in this embodiment.

This embodiment can be freely combined with any one of Embodiment Modes 1 to 3.

Embodiment 5

Figure 10A:
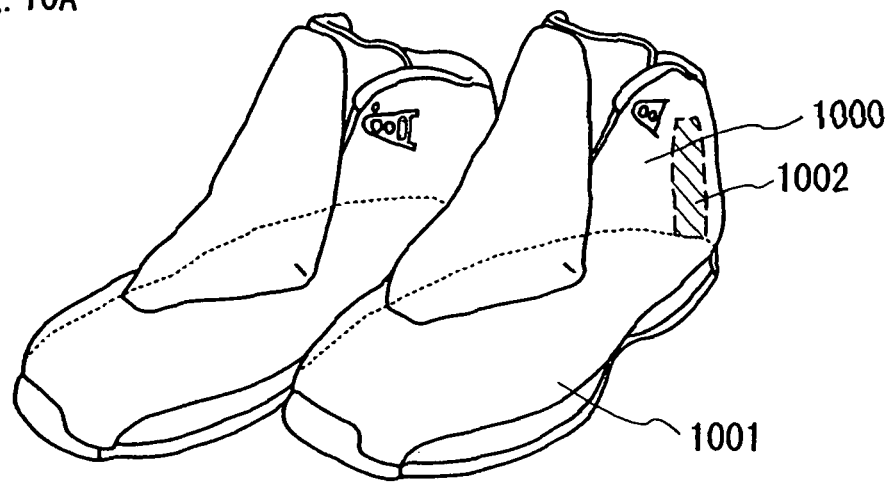
FIGS. 10A and 10B show an example of a sports implement (Embodiment 5)
Figure 10B:
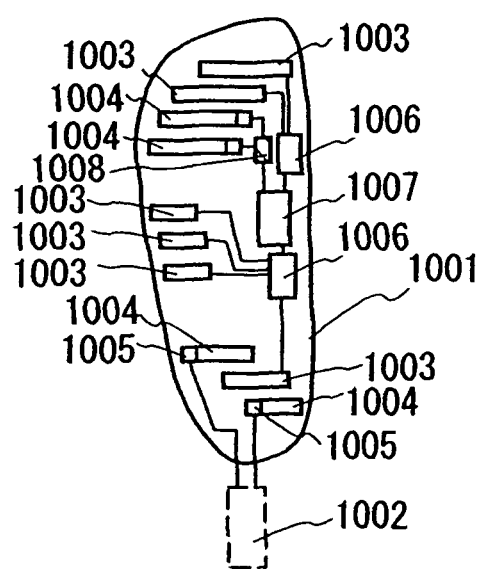
Figure 11:
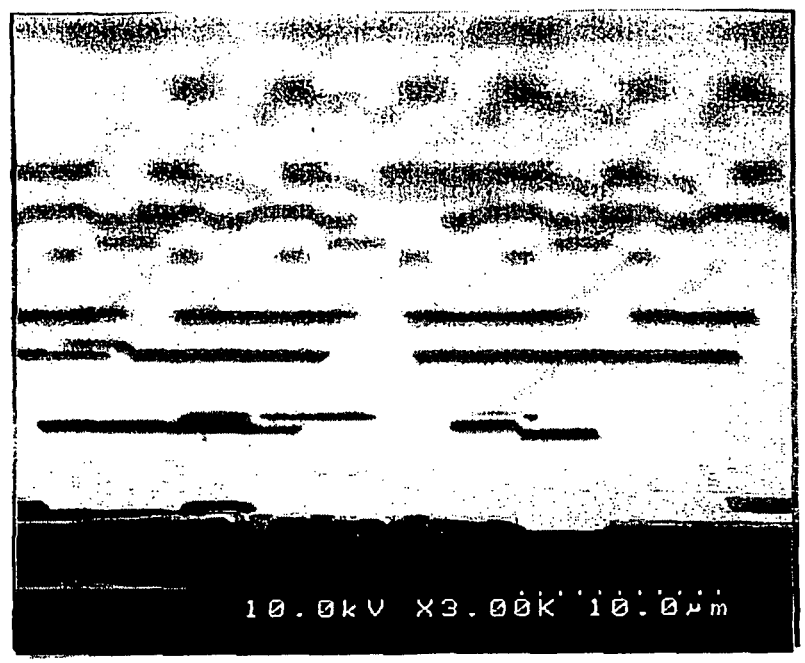
FIG. 11 is a photograph of a surface and a cross-section after transferring.
Figure 12:
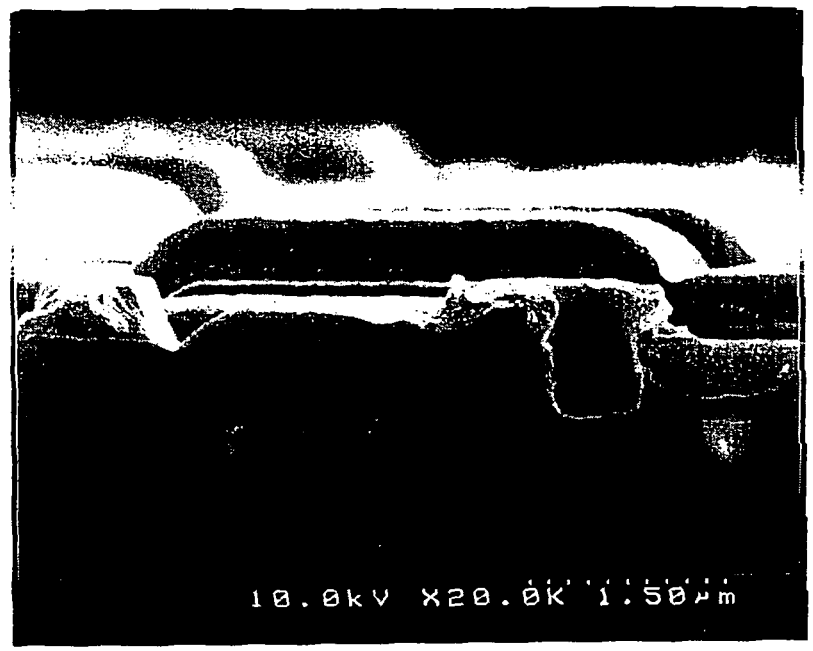
FIG. 12 is a SEM picture of a TFT cross-section.
Figure 13:
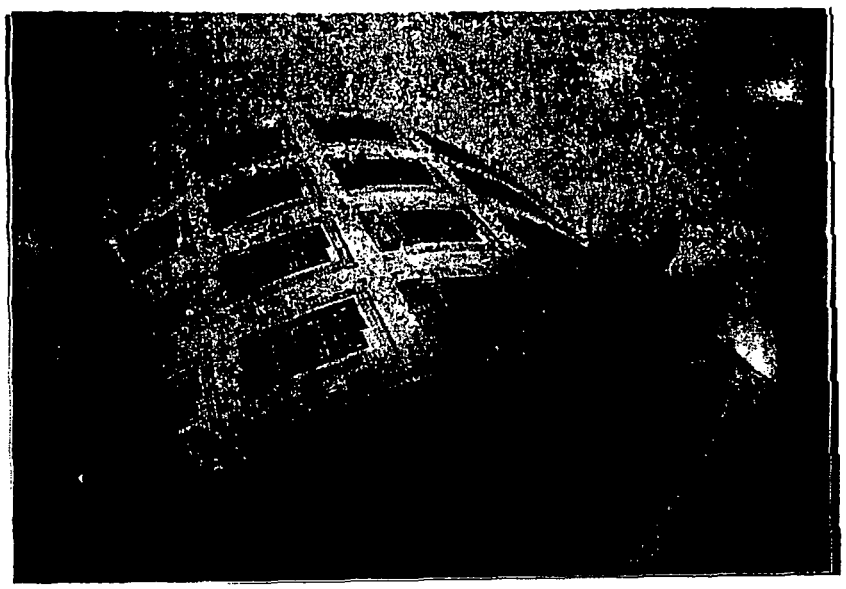
FIG. 13 is a photograph of a plurality of CPUs formed on a film substrate.
Figure 14:
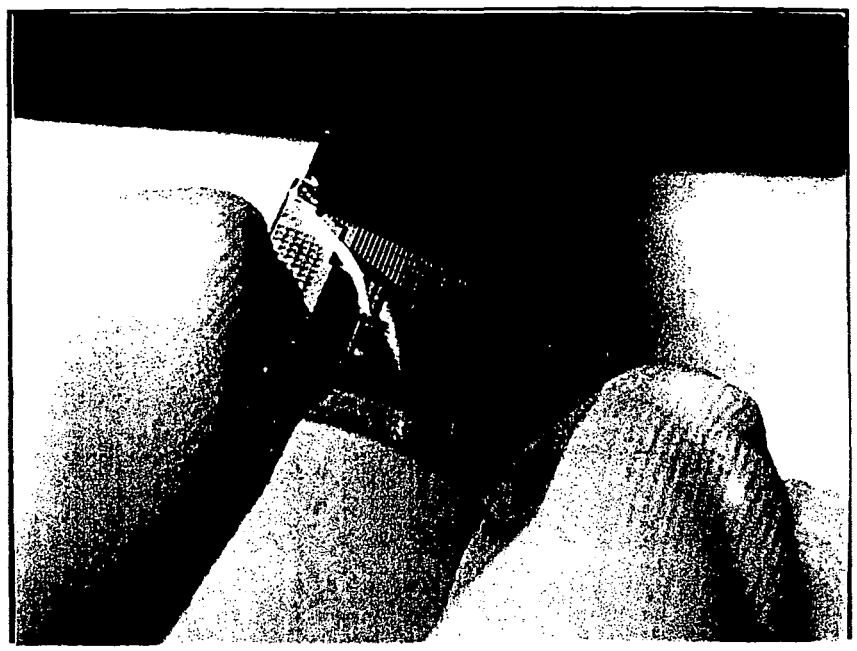
FIG. 14 is a photograph of a CPU of one chip formed on a film substrate.

In Embodiment 4, an example in which the present invention is applied to shoes as an example of a sports implement is shown in FIGS. 10A and 10B. FIG. 10A shows the appearance of shoes and FIG. 10B is a schematic diagram showing a circuit layout in a sole portion of the shoes.

In this embodiment, a piezoelectric element 1004 is provided in a sole portion 1001 of shoes 1000, and mechanical energy of an impact from the ground surface or a floor surface is changed into electric energy with the piezoelectric element, and the electric energy is used. Impact absorption is done effectively by providing the piezoelectric element 1004 in the sole portion 1001 of the shoes.

By using heat generated by driving a TFT, circuits 1003, 1005 and 1006 including TFTs are arranged in the sole portion 1001 of the shoes to heat indirectly the sole face of the shoes. The circuits including TFTs are thin, and sheet-like devices that each uses a flexible film as a base material. Thus, a user does not feel uncomfortable with the feet. Note that the circuit 1005 including a TFT is a rectifier unit including an amplifier circuit, the circuit 1006 including a TFT is a temperature control generation circuit including a CPU and a temperature sensor, and the circuit 1003 including a TFT is a circuit generating heat, a serpentine wiring or a heat-generating element. The electric power generated in the piezoelectric element 1004 may be stored in a charging portion 1007.

As shown in FIG. 10B, the circuits 1006 and 1008 including TFTs are arranged in the sole portion 1001 of the shoes, preferably a shank portion in which an arrangement space can be secured, the circuit 1003 including a TFT arranged partially generates heat using electric power produced by the vibration or impacts onto the piezoelectric element 1004 arranged in the heel portion of the sole portion.

For example, as for basket shoes, the sole face can be soft, can hold a floor strongly and does not slip easily by warming the sole face made of resin by heating the circuit 1003 including a TFT.

When various circuits are provided in shoes, it is desirable to install a central processing unit (CPU) including a TFT. A portion 1002 is preferable for the location for arranging a central processing unit (CPU), a sensor, a charging portion, a switch and the like.

In FIG. 10B, circuits that are driven separately are provided as a circuit group having a power 1007, and a circuit group having a power 1002, respectively. However, without limiting thereto, the circuits may be driven concurrently in cooperation with each other.

A circuit including a piezoelectric element or a TFT may be formed in running shoes. A piezoelectric element is arranged in a sole portion and warming feet is conducted by heating a TFT circuit using an electric power generated by vibration or impact on the sole portion when it is cold. In addition, a heat-generating element may be provided in the shoes separately, as well as such a TFT circuit. When it is hot, a peltiert element is provided separately in the shoes and the peltiert element is driven with the electric power from the piezoelectric element to cool foots down. In this way, a user can regulate temperature of shoes freely by himself/herself. A temperature sensor is arranged and heating and cooling are switched automatically by controlling with a CPU depending on a temperature of the temperature sensor.

This embodiment can be freely combined with any one of Embodiment Modes 1 to 3.

For example, if this embodiment is combined with Embodiment Mode 2, a simple display portion on which a user can recognize the present setting of the shoes may be provided in the portion 1002 of the shoes. In addition, an integrated circuit incorporating a power generation unit such as a solar battery may be provided in the shoes 1000. In addition, a contactless power transfer module that can be charged with electric power without contact may be provided in the shoes 1000, since it does not require replacement of the battery.

When this embodiment is combined with Embodiment Mode 3, a receiving circuit is incorporated in the portion 1002, and receives a signal from an external terminal (not sown) having a transmitting circuit, and conducts signal processing in the integrated circuit, thereby making the setting of the shoes 1000 possible. If the setting of the shoes can be changed by the external terminal, the appearance of the shoes can be made simple without providing a switch in the shoes 1000.

Embodiment 6

Figures 15A, 15B:
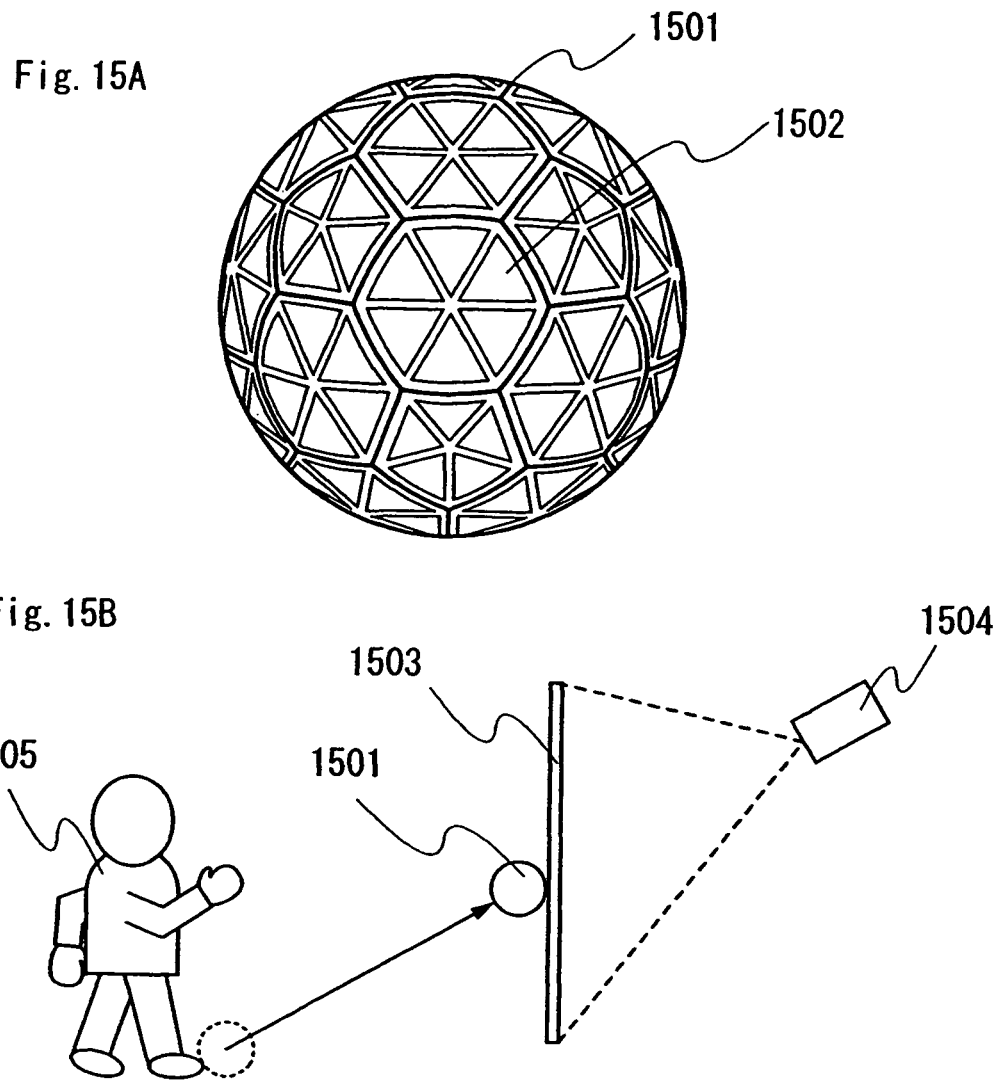
FIGS. 15A and 15B each show an example of a sports implement (Embodiment 6)

Embodiment 6 shows an example in which the present invention is applied to a soccer ball as an example of a sports implement in FIG. 15A.

In FIG. 15A, a soccer ball 1501 to which a plurality of integrated circuits 1502 each having a piezoelectric element, an amplifier circuit and a light emitting element are attached is shown. In addition, it is preferable that the integrated circuit 1502 having a piezoelectric element, an amplifier circuit and a light emitting element can be freely attached onto and removed from the ball.

When a soccer ball 1501 of the present invention is kicked, a piezoelectric element of the kicked point generates electric power, the electric power is amplified by the amplifier circuit, and then the light-emitting element can emit light using the electric power Therefore, only the point where an impact or vibration is given emits light instead of emitting light from the entire surface of the soccer ball. The light emitting element emits light similarly when the soccer ball is hit on the ground or a wall. In general, it is difficult to practice soccer in the night, since soccer is played in a wide place. It is greatly expensive to use a place provided with outdoor lightning for nights. If a soccer ball of the present invention is employed, practicing soccer in the night is possible since the ball emits light partially. When the integrated circuit 1502 having a piezoelectric element, an amplifier circuit and a light emitting element is broken by the impact given to the ball, it may be replaced by a new integrated circuit. The integrated circuit 1502 having a piezoelectric element, an amplifier circuit and a light emitting element is provided on a flexible film and the flexible film has an adhesive surface. Therefore, the integrated circuit 1502 having a piezoelectric element, an amplifier circuit and a light emitting element can be freely attached onto and removed from even a spherical surface like a ball. The integrated circuit 1502 may include a charging unit for storing electric power.

The soccer ball of the present invention becomes also a novel amusement tool. For example, the soccer ball can be applied to a sports game of soccer in a game arcade or the like. An amusement with the use of the ball of the present invention is shown briefly in FIG. 15B. If a player 1505 kicks a soccer ball 1501 toward a light transmitting sheet 1503, the kicked portion of the soccer ball emits light at the instance when the soccer ball is kicked, and also emits light at the instance when the ball is hit on the sheet. The sheet 1503 that is flexible absorbs the impact from the ball and prevents the ball from bouncing to the player. The sheet 1503 is light-transmitting, and thus light-emission from the ball is emitted to the opposite side of the player 1505 through the sheet. If an imaging unit 1504 such as a CCD camera is provided on the opposite side of the player 1505 through the sheet, the position of the sheet on which the ball is hit or the kicked position of the ball can be recognized. Thus, the orbit of the ball can be determined. If the distance between the position where a user kicks a ball and the sheet on which the ball is hit is fixed, the speed of the ball can be calculated and measured from the time difference between two light-emission, which are obtained by a CCD camera or the like.

An integrated circuit having a piezoelectric element, an amplifier circuit and a light emitting element can be installed in various types of balls, without limiting to soccer balls. For example, an integrated circuit having a piezoelectric element, an amplifier circuit and a light emitting element can be installed in a tennis ball or a squash ball. For example, if the method shown in FIG. 15B is employed, an auto tennis field can be provided, which can determine whether or not a ball goes over a net by using a sheet having the same height as the net.

Embodiment 7

Embodiment 7 shows an example in which the present invention is applied to clothes (wear) such as a training wear as an example of a sports implement in FIG. 16.

Figure 16A:
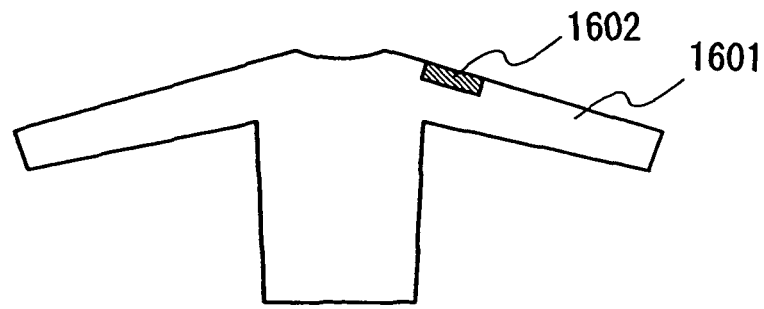
FIGS. 16A to 16C each show an example of a sports implement (Embodiment 7).

In FIG. 16A, a wear 1601 to which an integrated circuit 1602 having an antenna, a piezoelectric element, an amplifier circuit and a memory element is attached is shown. In addition, it is preferable that integrated circuit 1602 having an antenna, a piezoelectric element, an amplifier circuit and a memory element can be freely attached to a wear and removed from it. The wear 1601 is provided with the integrated circuit 1602 having at least a transmitting circuit or receiving circuit.

Figure 16B:
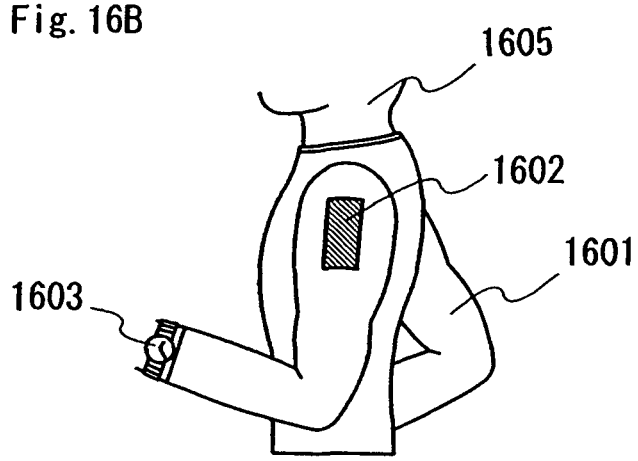
Figure 16C:
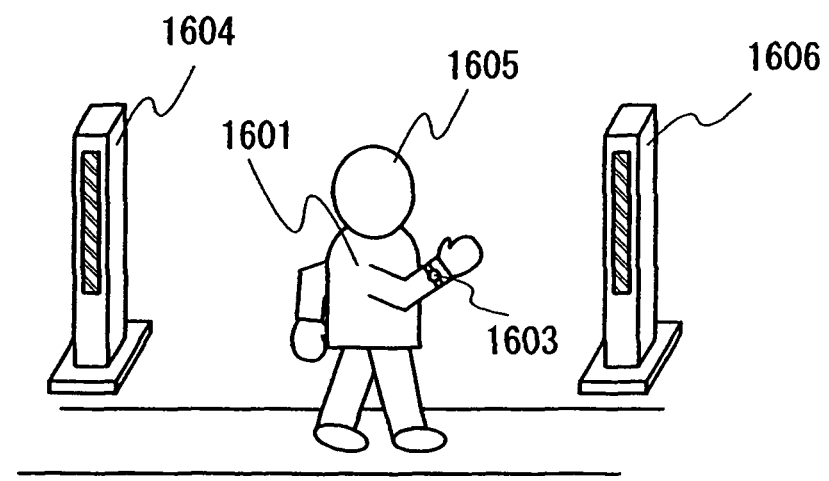
Figure 17:
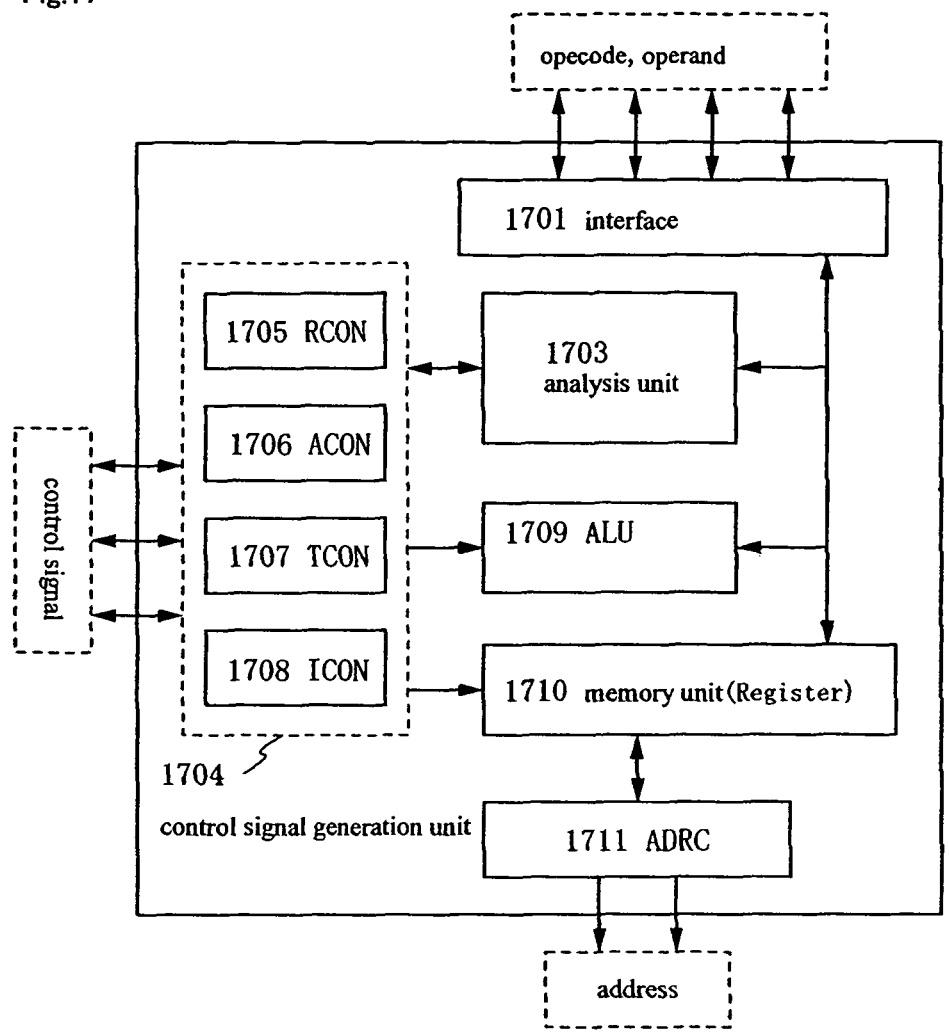
FIG. 17 is a block diagram.

The clothes (wear) of the present invention become a novel training tool. For example, the wear of the present invention can be employed for measuring the run-time between two points. Training with the use of the wear 1601 of the present invention is shown briefly in FIG. 16C. A player 1605 wearing the wear 1601 of the present invention wears a watch 1603 and adjust the time of clocks incorporated in two gates. A gate 1604 is arranged at a starting point and a gate 1606 is arranged at a goal point. The player 1605 wearing the wear 1601 of the present invention comes close to a transmitting circuit or a receiving circuit incorporated in the gate 1604 at the starting point, and thus a signal can be sent and received with an integrated circuit installed in the wear. The integrated circuit 1602 is provided in the left arm of the player 1605 wearing the clothes 1601 of the present invention as shown in FIG. 16B in this embodiment.

The piezoelectric element generates strain by being provided with a vibration of body movements e.g., arm movements or by being warped by stretching of clothes or the like, the generated current is amplified in the amplifier circuit, and then electric power is supplied to the integrated circuit. Further, the integrated circuit 1602 may include a charging unit for storing electric power.

The player 1605 leaves the gate 1604 at the starting point, and the time is recorded in the gate. At the time transmission and reception of a signal is suspended. The player comes close to the gate 1606 installed at the goal point and passes beside the gate 1606, and therefore, transmission and reception of a signal is conducted. And the time of the signal transmission and reception is recorded in the gate 1606. By comparing each time stored in the gates 1604 and 1606, the run-time between the two points can be measured by himself/herself. It has been difficult to perform precise measurement of time in field-and-track events on one's own.

This method is possible on the snow or the water. Conventionally, it has been difficult to perform precise measurement of time on one's own in winter sports. For example, by training according to the present invention, an integrated circuit at least having a transmitting circuit or a receiving circuit is provided for a skiwear, and gates are provided at a start point and a goal point respectively. If a skier is skiing therebetween, the time can be measured by the skier himself/herself. By training according to the present invention, an integrated circuit at least having a transmitting circuit or a receiving circuit is provided for a snowboardwear, and gates are provided at a start point and a goal point respectively. If a snowboarder is skiing therebetween, the time can be measured by the snowboarder himself/herself.

According to the present invention, an element or a circuit to be provided for a sports implement can be formed by using a TFT and a plurality of circuits or elements can be integrally formed. Therefore, the present invention is effective in mass-producing of a sports implement.

What is claimed is:

1. A sports implement comprising:
an EL display portion;
a piezoelectric element which generates electric power by warping the piezoelectric element due to a vibration or impact applied thereto;
an amplifier circuit operationally connected to the piezoelectric element;
an instruction unit including a switch configured to determine whether or not to control strain of the sports implement; and
a charging control circuit and a secondary battery for storing the electric power,
wherein the instruction unit is configured to be turned on and off by a user,
wherein the amplifier circuit and the piezoelectric element are formed on a same flexible film, and
wherein the flexible film, the amplifier circuit, and the piezoelectric element are attached onto a curved surface of the sports implement.

2. A sports implement according to claim 1, further comprising a rectifier unit operationally connected to the piezoelectric element.

3. A sports implement according to claim 1, wherein the amplifier circuit includes at least a TFT.

4. A sports implement according to claim 1, further comprising the EL display portion for displaying a result of a voltage application obtained in the instruction unit.

5. A sports implement according to claim 1, further comprising a receiving circuit or a transmitting circuit.

6. A sports implement according to claim 1, further comprising a central processing unit.

7. A sports implement according to claim 1, further comprising a memory element.

8. A sports implement according to claim 1, wherein the sports implement becomes warm or cool by the electric power.

9. A sports implement comprising:
an EL display portion;
a piezoelectric element which generates electric power by warping the piezoelectric element due to a vibration or impact applied thereto;
an amplifier circuit operationally connected to the piezoelectric element;
an instruction unit which determines whether or not to control strain of the sports implement;
a power supply circuit operationally connected to the amplifier circuit;
a secondary battery for storing the electric power, that is operationally connected to the power supply circuit; and
an electric power generation unit operationally connected to the secondary battery,
wherein the electric power generation unit is a solar battery,
wherein the piezoelectric element and the amplifier circuit and the solar battery are formed on a same flexible film, and
wherein the flexible film, the piezoelectric element, the amplifier circuit, and the solar battery are attached onto a curved surface of the sports implement.

10. A sports implement according to claim 9, further comprising a rectifier unit operationally connected to the piezoelectric element.

11. A sports implement according to claim 9, wherein the amplifier circuit includes at least a TFT.

12. A sports implement according to claim 9, further comprising the EL display portion for displaying a result of a voltage application obtained in the instruction unit.

13. A sports implement according to claim 9, further comprising a receiving circuit or a transmitting circuit.

14. A sports implement according to claim 9, further comprising a central processing unit.

15. A sports implement according to claim 9, further comprising a memory element.

16. A sports implement according to claim 9, wherein the sports implement becomes warm or cool by the electric power.

17. A sports implement comprising:
an EL element;
a first piezoelectric element which generates first electric power by warping the first piezoelectric element due to a vibration or impact applied thereto;
a first amplifier circuit operationally connected to the first piezoelectric element;
a power supply circuit operationally connected to the first amplifier circuit;
a secondary battery operationally connected to the power supply circuit;
a charging control circuit operationally connected to the secondary battery;
a second piezoelectric element which generates second electric power by warping the second piezoelectric element due to a vibration or impact applied thereto; and
a second amplifier circuit operationally connected to the charging control circuit and the second piezoelectric element wherein the second electric power is amplified by the second amplifier circuit to produce an amplified electric power,
wherein the EL element, the first amplifier circuit and the first piezoelectric element are formed on a same flexible film, and
wherein the flexible film, the EL element, the first amplifier circuit, and the first piezoelectric element are attached onto a curved surface of the sports implement.

18. A sports implement according to claim 17, further comprising a rectifier unit operationally connected to the first piezoelectric element.

19. A sports implement according to claim 17, wherein the first amplifier circuit includes at least a TFT.

20. A sports implement according to claim 17, further comprising a receiving circuit or a transmitting circuit.

21. A sports implement according to claim 17, further comprising a central processing unit.

22. A sports implement according to claim 17, further comprising a memory element.

23. A sports implement according to claim 17, wherein the sports implement becomes warm or cool by the electric power.

24. A sports implement comprising:
a piezoelectric element;
an amplifier circuit operationally connected to the piezoelectric element; and
an EL element,
wherein the piezoelectric element is warped by being applied to a vibration or impact to generate electric power, and the EL element emits light using the electric power,
wherein the piezoelectric element, the amplifier circuit, and the EL element are formed on a same flexible film, and
wherein the flexible film, the piezoelectric element, the amplifier circuit, and the EL element are attached onto a curved surface of the sports implement.

25. A sports implement according to claim 24, wherein the amplifier circuit includes at least a TFT.

26. A sports implement according to claim 24, further comprising a central processing unit.

27. A sports implement comprising:
an EL element;
a piezoelectric element;
an amplifier circuit operationally connected to the piezoelectric element; and
a receiving circuit including an antenna,
wherein the piezoelectric element is warped by being applied to a vibration or impact to generate electric power, and the amplifier circuit and the receiving circuit are supplied with the electric power, and
wherein the receiving circuit receives a signal from an external terminal,
wherein the sports implement measures a run-time between two points,
wherein the amplifier circuit and the piezoelectric element are formed on a same flexible film, and
wherein the flexible film, the amplifier circuit, and the piezoelectric element are attached onto a curved surface of the sports implement.

28. A sports implement according to claim 27, further comprising a central processing unit.

29. A sports implement according to claim 27, further comprising a memory element.

30. A sports implement according to claim 27, wherein the amplifier circuit includes at least a TFT.

31. A sports implement according to claim 1, further comprising a control signal generation circuit to form a control signal, and
wherein the instruction unit determines an application of the control signal for controlling strain to the first piezoelectric element.

32. A sports implement according to claim 9, further comprising a control signal generation circuit to form a control signal, and
wherein the instruction unit determines an application of the control signal for controlling strain to the first piezoelectric element.

33. A sports implement according to claim 17, further comprising a receiving circuit which receives a signal from an external terminal including a transmitting circuit and a communication control circuit.

34. A sports implement comprising:
an EL element;
a piezoelectric element which generates electric power by warping the piezoelectric element due to a vibration or impact applied thereto;
an amplifier circuit operationally connected to the piezoelectric element;
an instruction unit including a switch configured to determine whether or not to control strain of the sports implement;
a power supply circuit operationally connected to the amplifier circuit;
a secondary battery for storing electric power, that is operationally connected to the power supply circuit; and
a pointless electric power transmission module operationally connected to the secondary battery,
wherein the instruction unit is configured to be turned on and off by a user,
wherein the amplifier circuit and the piezoelectric element are formed on a same flexible film, and
wherein the flexible film, the piezoelectric element, the amplifier circuit, and the EL element are attached onto a curved surface of the sports implement.

35. A sports implement according to claim 34, wherein the amplifier circuit includes at least a TFT.

36. A sports implement according to claim 34, wherein the EL element, the amplifier circuit and the piezoelectric element are formed on a same flexible film.

37. A sports implement according to claim 1, wherein the instruction unit uses an external terminal through remote-controlling of the sports implement.

38. A sports implement according to claim 34, wherein the instruction unit uses an external terminal through remote-controlling of the sports implement.

39. A sports implement according to claim 1, wherein the sports implement becomes warm by a circuit including at least a TFT.

40. A sports implement according to claim 1, wherein the sports implement measures a run-time between two points.

41. A sports implement according to claim 9, wherein the instruction unit is configured to be turned on and off by a user.

* * * * *